US012262532B2

(12) United States Patent
Simsek-Ege

(10) Patent No.: US 12,262,532 B2
(45) Date of Patent: Mar. 25, 2025

(54) MICROELECTRONIC DEVICES AND ELECTRONIC SYSTEMS

(71) Applicant: Micron Technology, Inc., Boise, ID (US)

(72) Inventor: Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/429,004

(22) Filed: Jan. 31, 2024

(65) Prior Publication Data

US 2024/0172425 A1 May 23, 2024

Related U.S. Application Data

(62) Division of application No. 17/364,379, filed on Jun. 30, 2021, now Pat. No. 11,930,634.

(51) Int. Cl.
*H10B 12/00* (2023.01)
*H01L 25/065* (2023.01)
*H10B 80/00* (2023.01)

(52) U.S. Cl.
CPC ....... *H10B 12/485* (2023.02); *H01L 25/0657* (2013.01); *H10B 12/0335* (2023.02);
(Continued)

(58) Field of Classification Search
None
See application file for complete search history.

(56) References Cited

U.S. PATENT DOCUMENTS 5,953,630 A 9/1999 Maeda et al.
8,067,286 B2 11/2011 Parekh et al.
(Continued)

FOREIGN PATENT DOCUMENTS

CN 112614853 A 4/2021
CN 112802855 A 5/2021
(Continued)

OTHER PUBLICATIONS

International Search Report for International Application No. PCT/US2022/072839, mailed Oct. 7, 2022, 4 pages.
(Continued)

*Primary Examiner* — Steven M Christopher
(74) *Attorney, Agent, or Firm* — TraskBritt

(57) ABSTRACT

A method of forming a microelectronic device comprises forming a microelectronic device structure comprising memory cells, digit lines, word lines, and at least one isolation material covering and surrounding the memory cells, the digit lines, and the word lines. An additional microelectronic device structure comprising control logic devices and at least one additional isolation material covering and surrounding the control logic devices is formed. The additional microelectronic device structure is attached to the microelectronic device structure. Contact structures are formed to extend through the at least one isolation material and the at least one additional isolation material. Some of the contact structures are coupled to some of the digit lines and some of the control logic devices. Some other of the contact structures are coupled to some of the word lines and some other of the control logic devices. Microelectronic devices, electronic systems, and additional methods are also described.

20 Claims, 23 Drawing Sheets

(52) U.S. Cl.
CPC ......... *H10B 12/315* (2023.02); *H10B 12/482* (2023.02); *H10B 12/488* (2023.02); *H10B 12/50* (2023.02); *H10B 80/00* (2023.02)

(56) References Cited

U.S. PATENT DOCUMENTS

| | | | |
|---|---|---|---|
| 8,153,499 | B2 | 4/2012 | Or-Bach et al. |
| 8,184,471 | B2 | 5/2012 | Woo et al. |
| 8,546,188 | B2 | 10/2013 | Liu et al. |
| 8,716,116 | B2 | 5/2014 | Parekh et al. |
| 9,012,292 | B2 | 4/2015 | Lee |
| 9,543,433 | B2 | 1/2017 | Anathan et al. |
| 10,510,738 | B2 | 12/2019 | Kim et al. |
| 11,114,335 | B1 | 9/2021 | Lu |
| 11,557,572 | B2 | 1/2023 | Huang |
| 11,562,985 | B2 | 1/2023 | Liu et al. |
| 2002/0127846 | A1 | 9/2002 | Burrell et al. |
| 2009/0108318 | A1 | 4/2009 | Yoon et al. |
| 2009/0168482 | A1 | 7/2009 | Park et al. |
| 2010/0155932 | A1 | 6/2010 | Gambino et al. |
| 2010/0230724 | A1 | 9/2010 | Sinha et al. |
| 2014/0117420 | A1 | 5/2014 | Chen et al. |
| 2016/0260756 | A1 | 9/2016 | Yamagishi |
| 2019/0043836 | A1 | 2/2019 | Fastow et al. |
| 2019/0074277 | A1 | 3/2019 | Ramaswamy |
| 2019/0103302 | A1 | 4/2019 | Yoon |
| 2019/0104260 | A1 | 4/2019 | Izuhara |
| 2019/0164914 | A1 | 5/2019 | Hu et al. |
| 2019/0214560 | A1 | 7/2019 | Brightsky |
| 2019/0244933 | A1 | 8/2019 | Or-Bach et al. |
| 2020/0066730 | A1 | 2/2020 | Guo et al. |
| 2020/0083229 | A1 | 3/2020 | Kim et al. |
| 2020/0111793 | A1 | 4/2020 | Kim et al. |
| 2020/0203272 | A1 | 6/2020 | Doebler et al. |
| 2020/0258876 | A1 | 8/2020 | Hosoda et al. |
| 2020/0286875 | A1* | 9/2020 | Nishida ................. H01L 25/50 |
| 2020/0328186 | A1 | 10/2020 | Liu |
| 2020/0328188 | A1 | 10/2020 | Liu et al. |
| 2020/0350014 | A1 | 11/2020 | Liu |
| 2020/0395328 | A1 | 12/2020 | Fastow et al. |
| 2020/0411524 | A1 | 12/2020 | Arslan et al. |
| 2021/0036015 | A1 | 2/2021 | Lim et al. |
| 2021/0043606 | A1 | 2/2021 | Bowers et al. |
| 2021/0118887 | A1 | 4/2021 | Kuo |
| 2021/0118890 | A1 | 4/2021 | Kim et al. |
| 2021/0143115 | A1 | 5/2021 | Wu et al. |
| 2021/0159216 | A1 | 5/2021 | Wu et al. |
| 2021/0183996 | A1 | 6/2021 | Lee et al. |
| 2021/0217716 | A1 | 7/2021 | Wu et al. |
| 2021/0257266 | A1 | 8/2021 | Lae |
| 2021/0265295 | A1 | 8/2021 | Liu et al. |
| 2021/0296284 | A1* | 9/2021 | Sharangpani ........... H01L 24/80 |
| 2021/0383874 | A1 | 12/2021 | Oh et al. |
| 2021/0398967 | A1 | 12/2021 | Parekh |
| 2021/0407980 | A1 | 12/2021 | Young et al. |
| 2022/0005820 | A1 | 1/2022 | Kim et al. |
| 2022/0052010 | A1 | 2/2022 | Goda et al. |
| 2022/0077090 | A1 | 3/2022 | Setta |
| 2022/0077129 | A1 | 3/2022 | Sung et al. |
| 2022/0085048 | A1 | 3/2022 | Lee et al. |
| 2022/0123006 | A1 | 4/2022 | Ahn et al. |
| 2022/0216239 | A1 | 7/2022 | Yoo et al. |
| 2022/0302150 | A1 | 9/2022 | Zhang et al. |
| 2022/0328493 | A1 | 10/2022 | Wang et al. |
| 2022/0367505 | A1 | 11/2022 | Chen et al. |
| 2022/0399309 | A1 | 12/2022 | Simsek-Ege |
| 2023/0015040 | A1 | 1/2023 | Or-Bach et al. |

FOREIGN PATENT DOCUMENTS

| | | |
|---|---|---|
| CN | 113053435 A | 6/2021 |
| TW | 201523855 A | 6/2015 |
| TW | 202125778 A | 7/2021 |
| WO | 2008/063251 A2 | 5/2008 |
| WO | 2020/211272 A1 | 10/2020 |

OTHER PUBLICATIONS

International Written Opinion for International Application No. PCT/US2022/072839, mailed Oct. 7, 2022, 5 pages.
Simsek-Ege et al., U.S. Appl. No. 17/364,377 (Year: 2021).
Simsek-Ege et al., U.S. Appl. No. 17/364,476 (Year: 2021).
Taiwanese Search Report and Office Action from Taiwanese Application No. 111123373, dated Jun. 14, 2023, 9 pages with English translation.
European Extended Search Report and Opinion for European Application No. 22834364.6, dated Jan. 2, 2025, 10 pages.

* cited by examiner

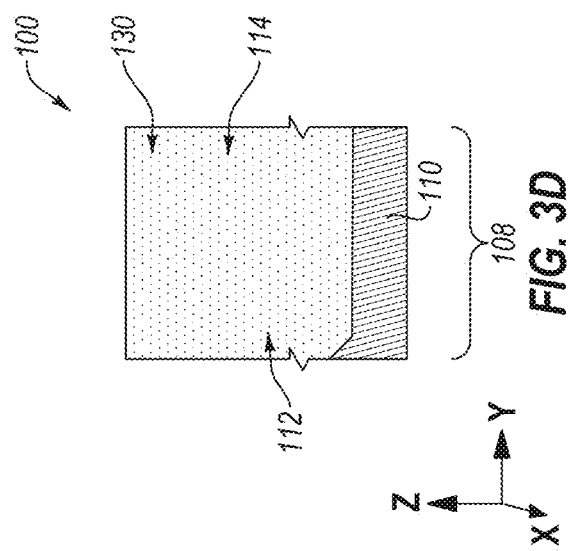
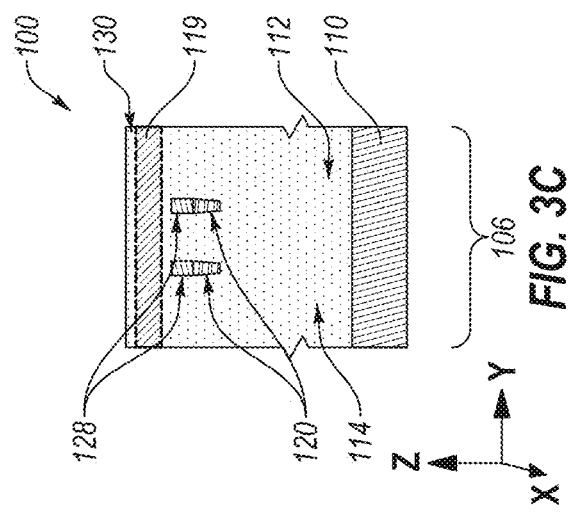

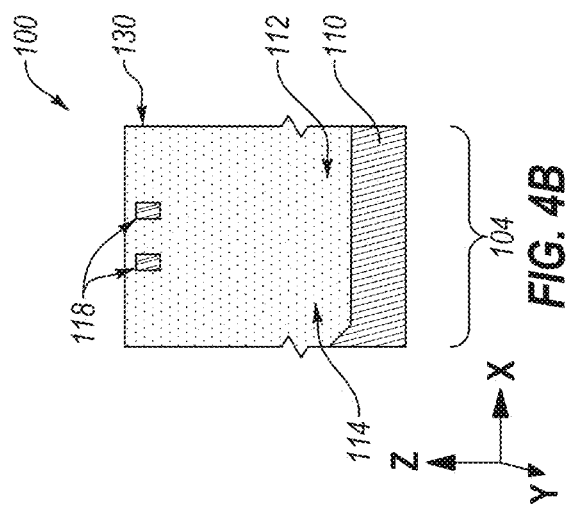
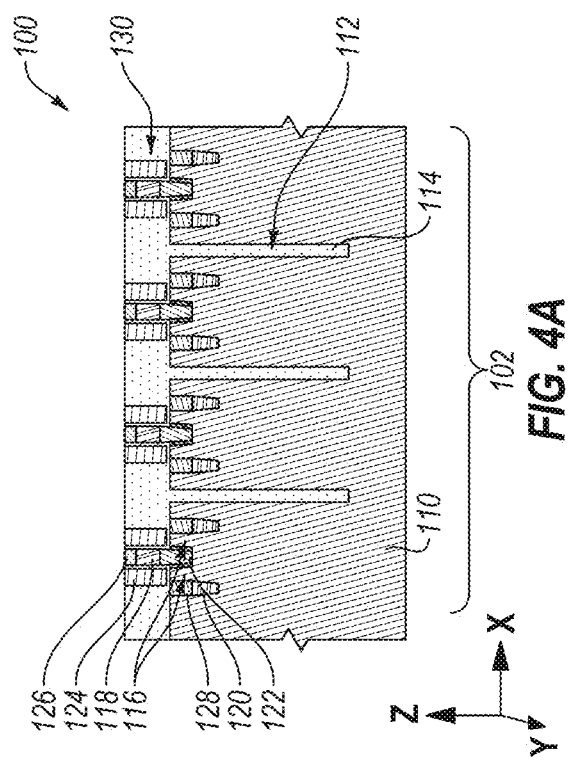

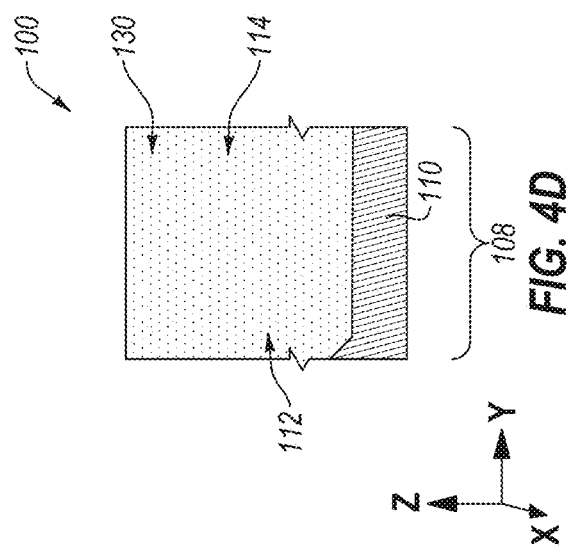
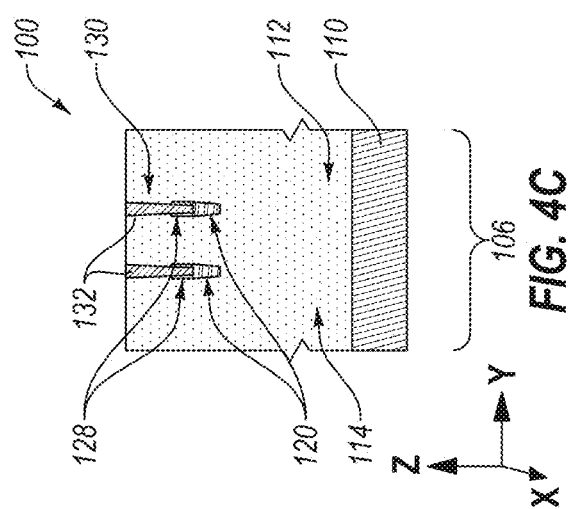

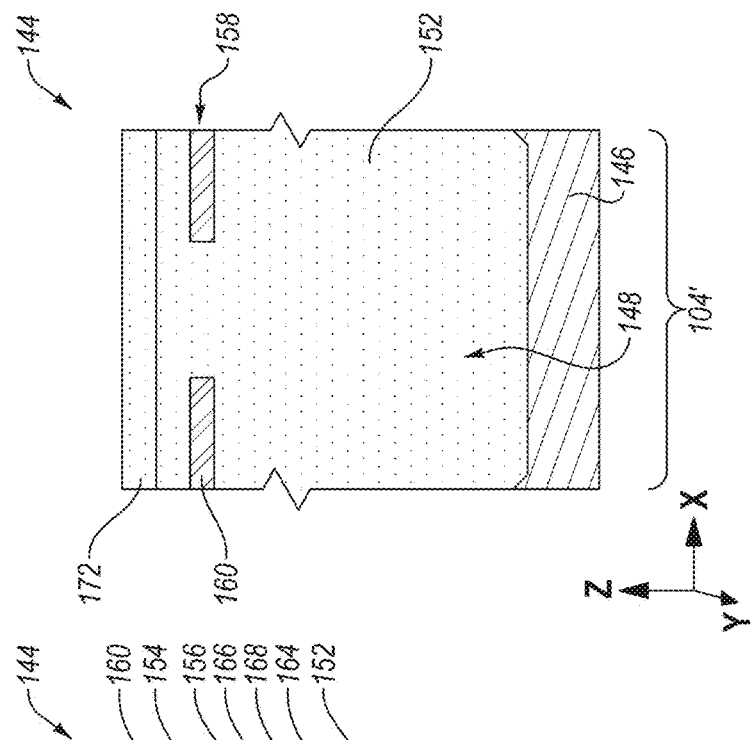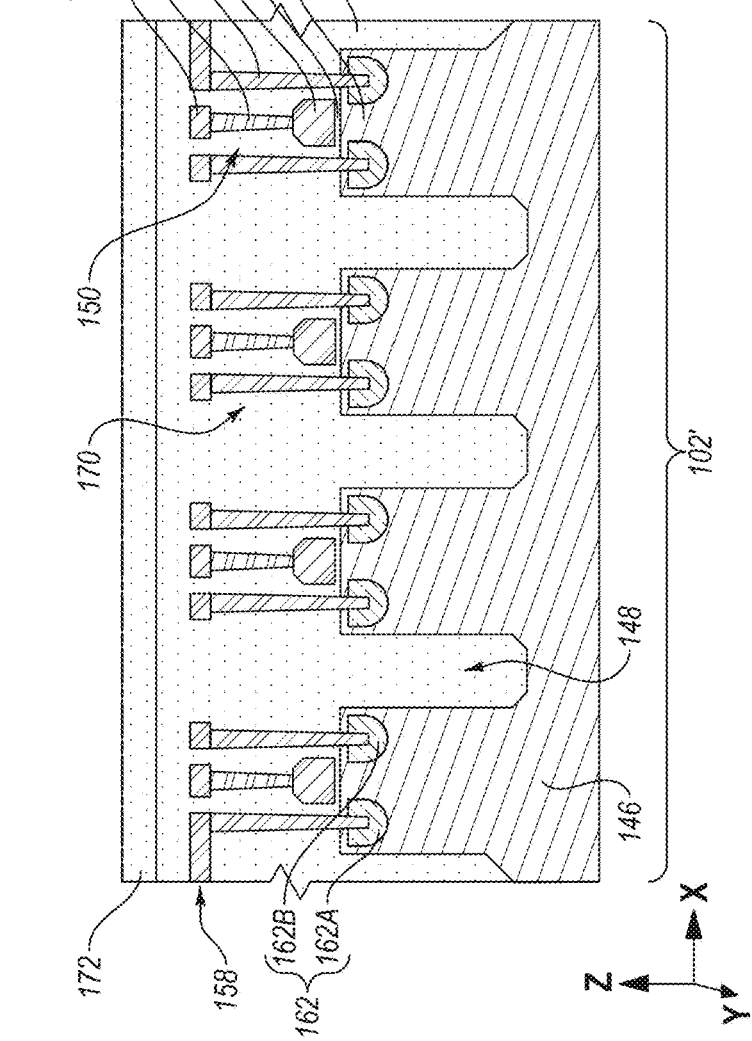
FIG. 6A
FIG. 6B

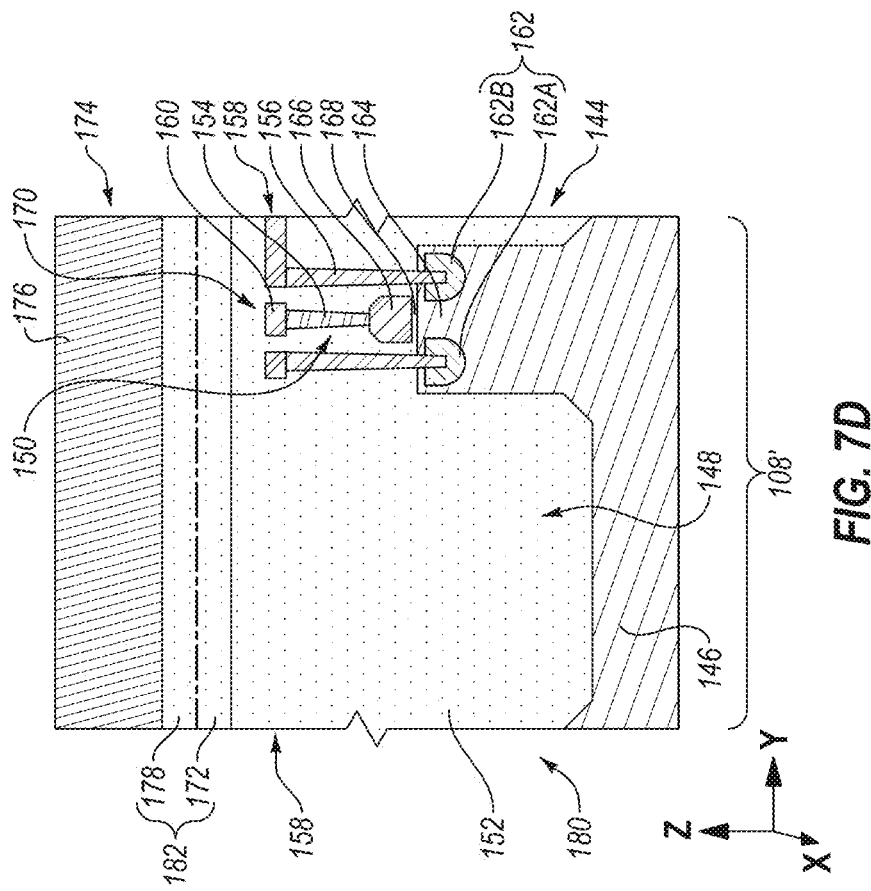
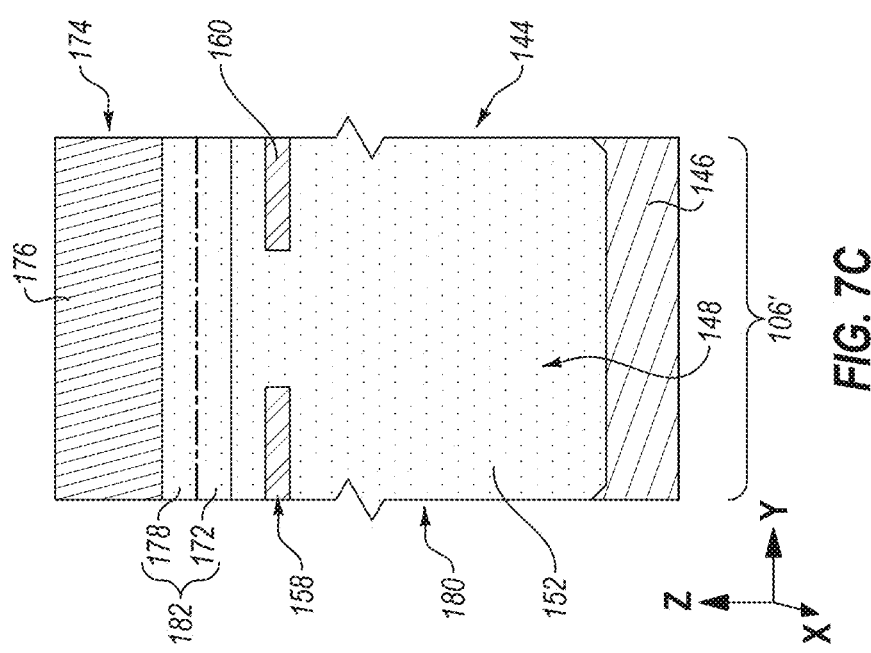

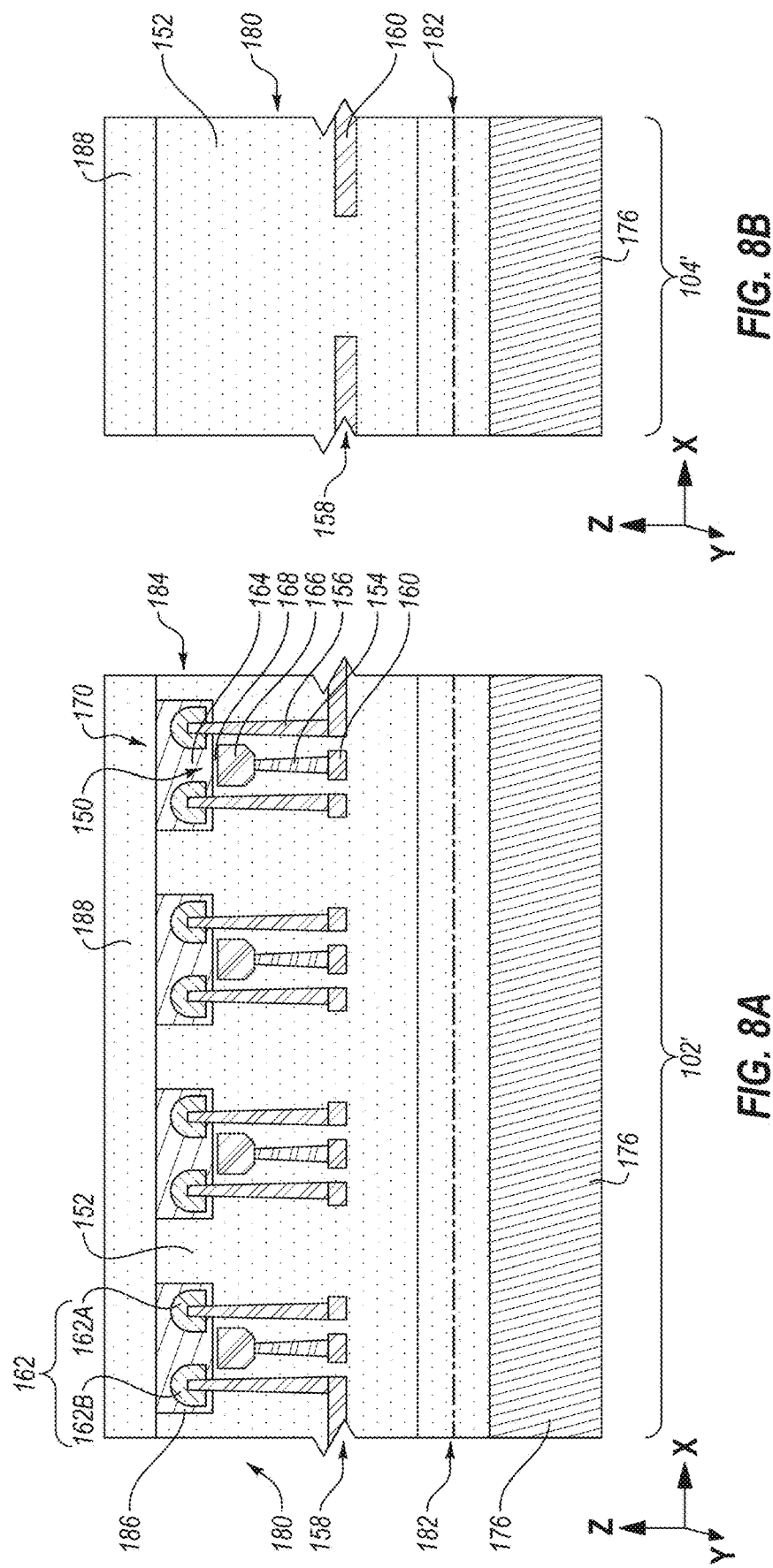

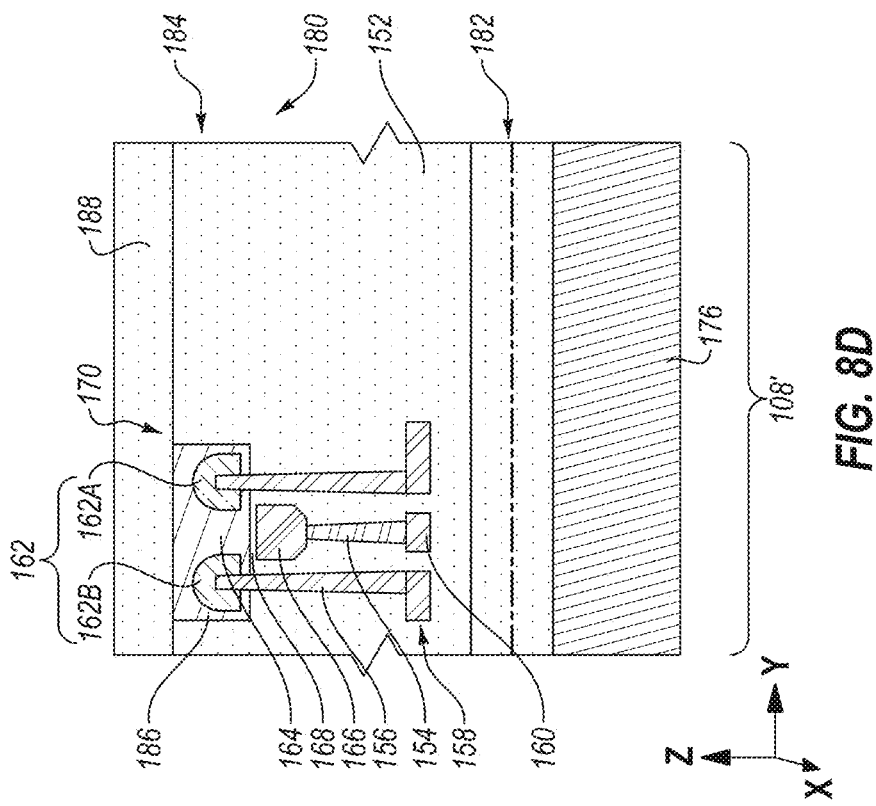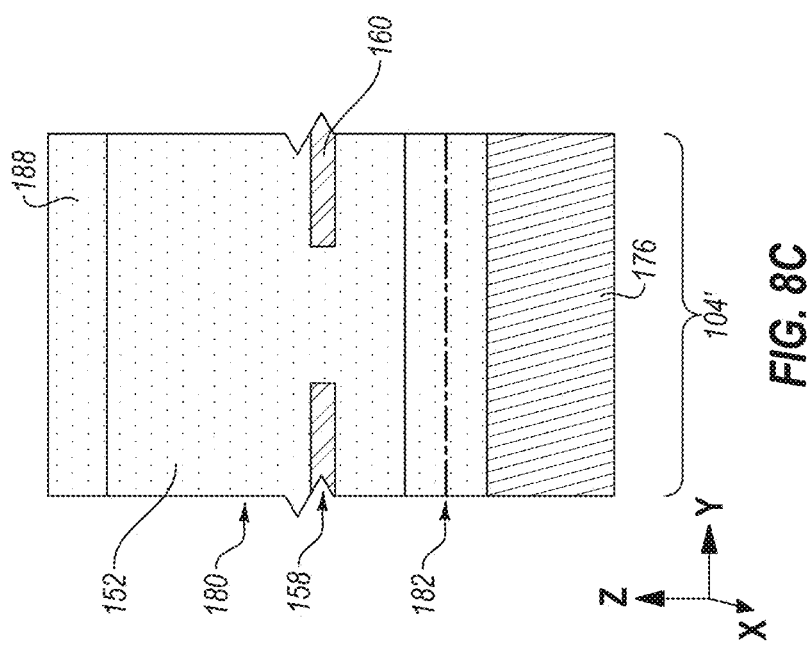

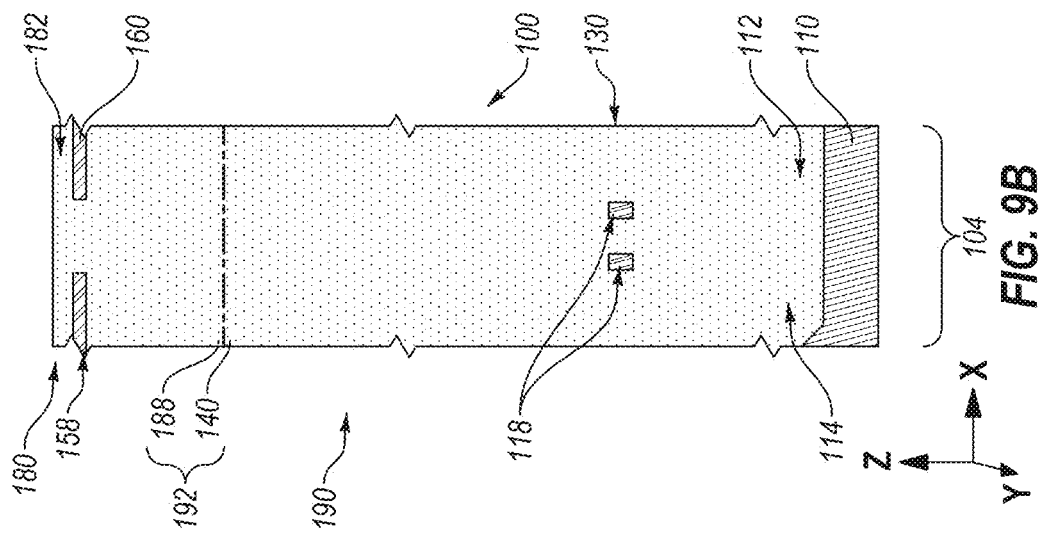
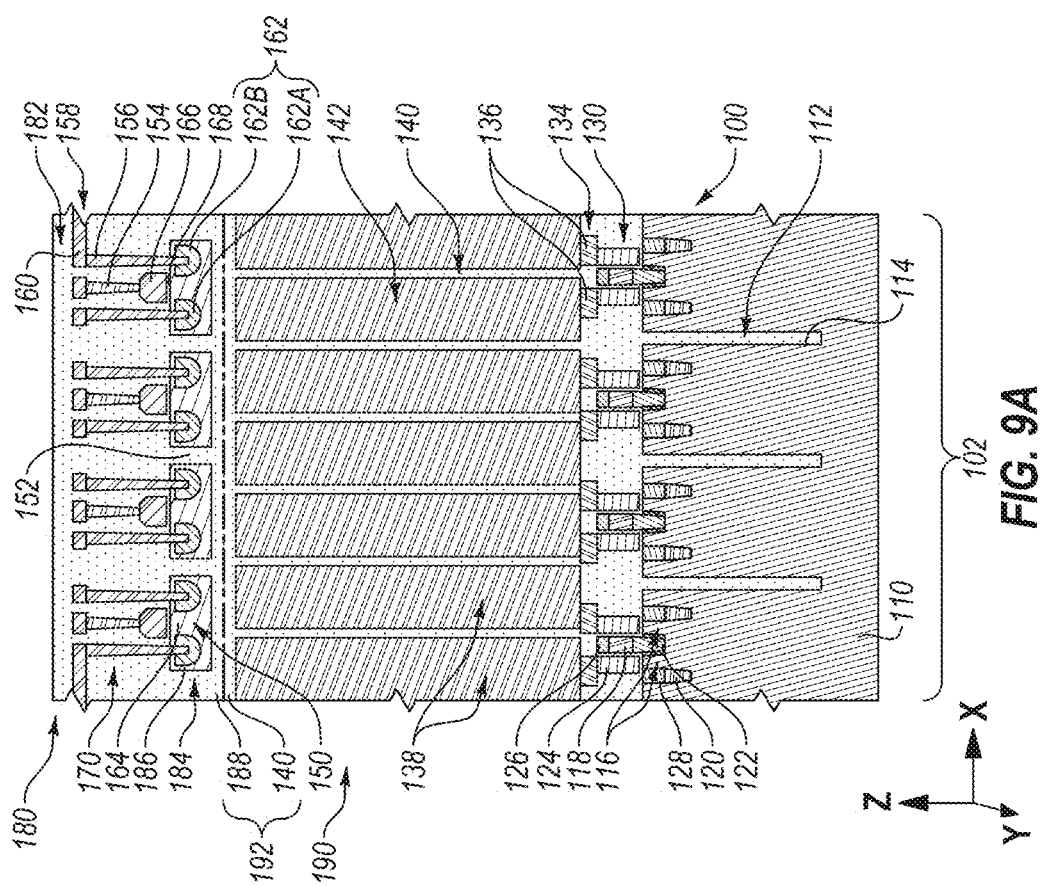

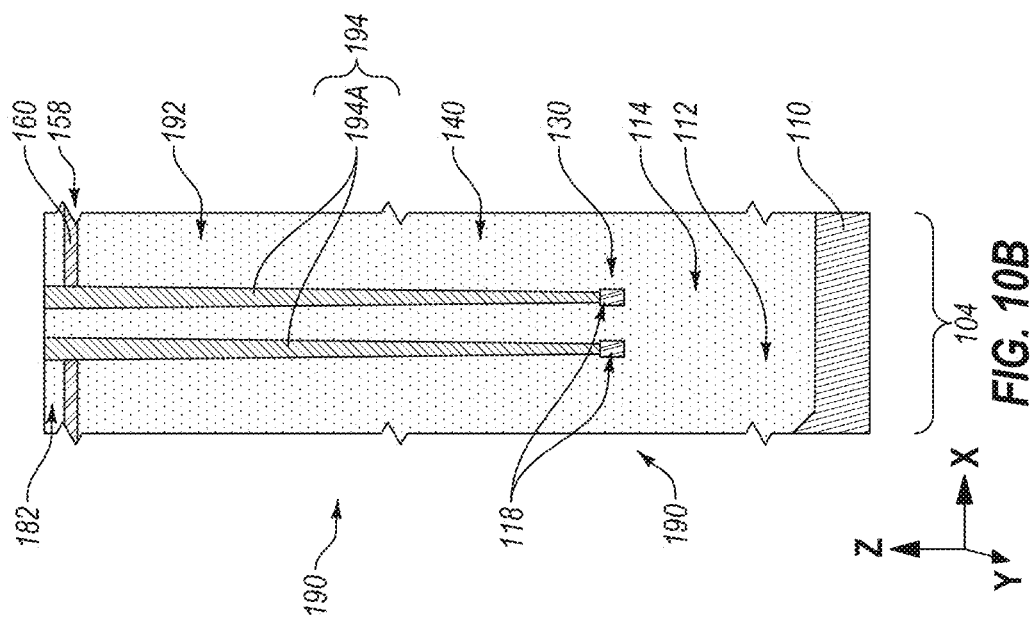
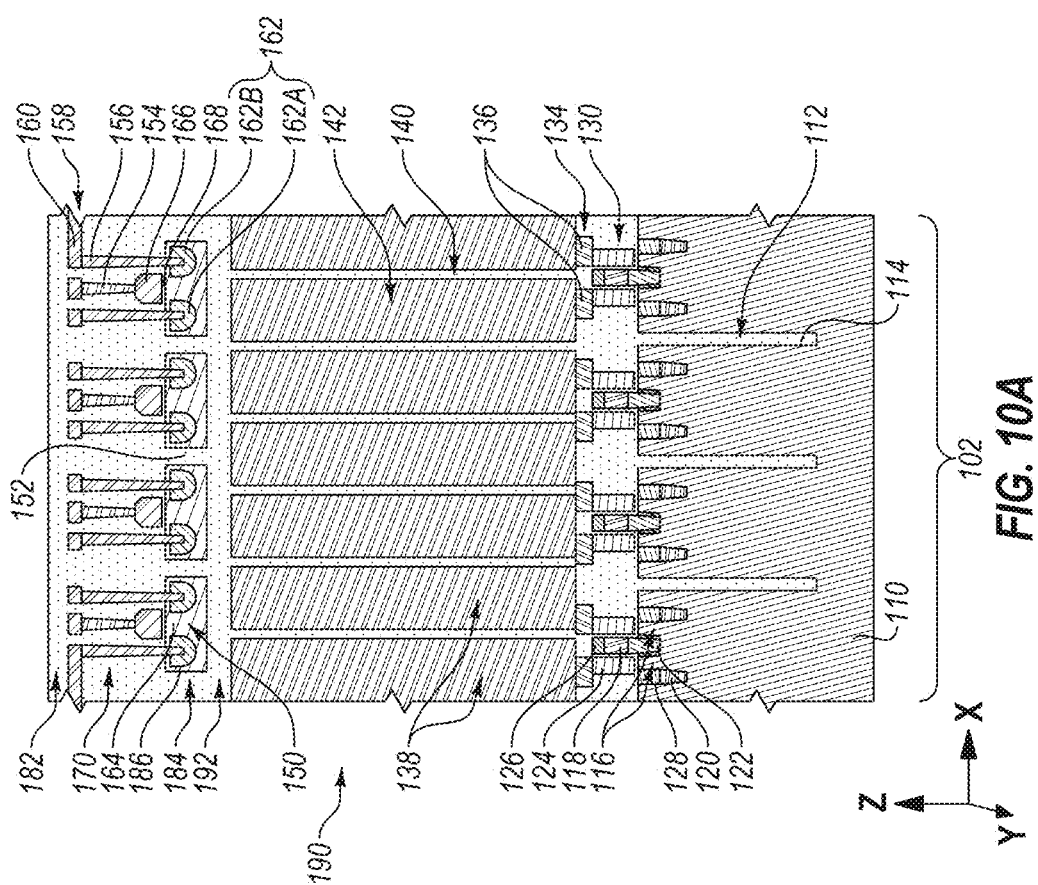

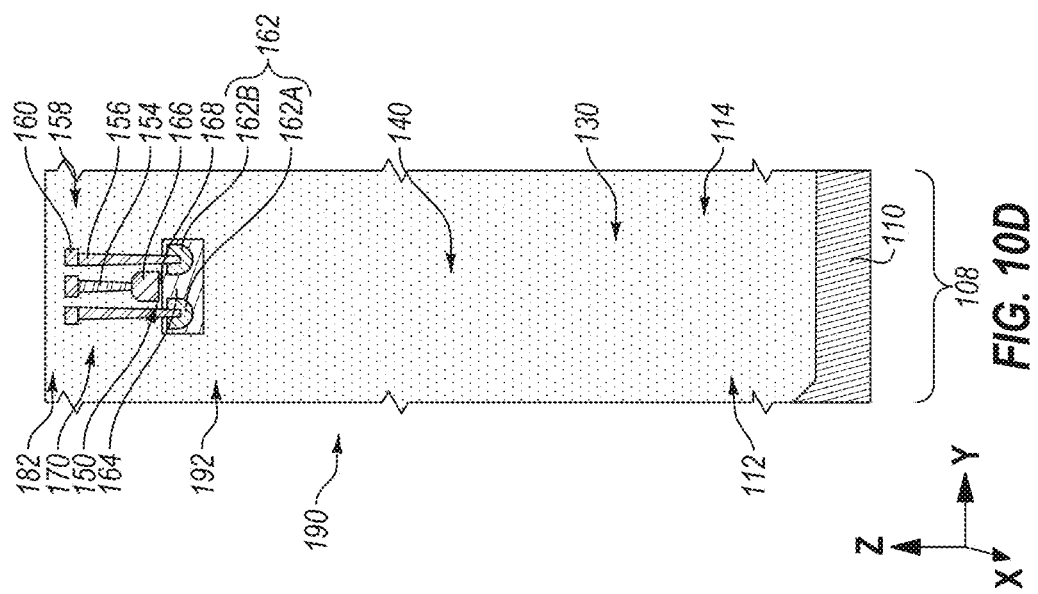
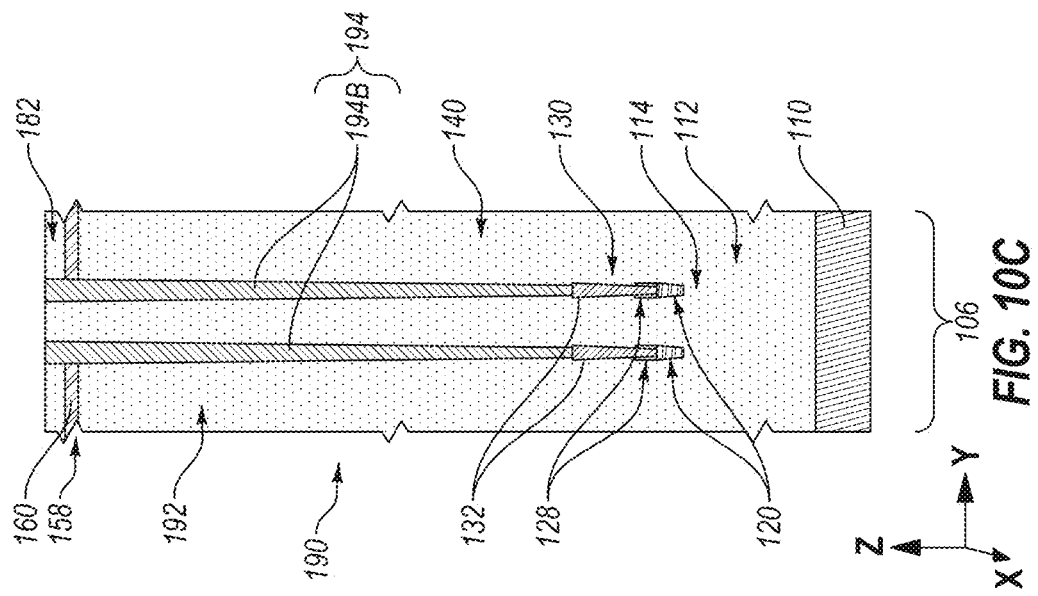

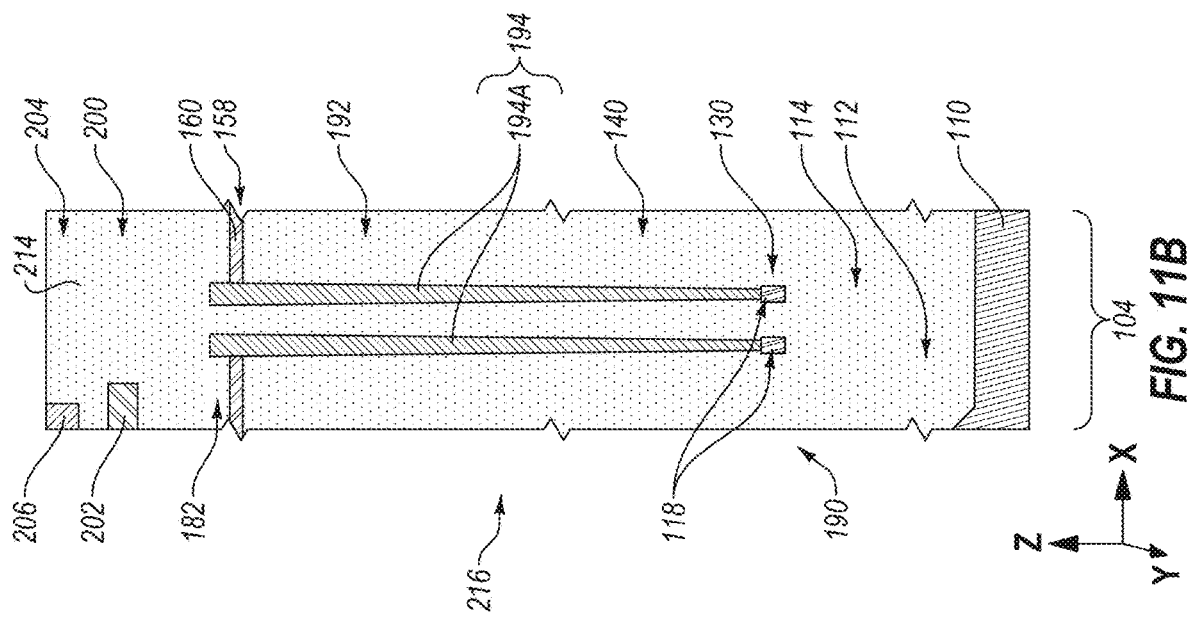
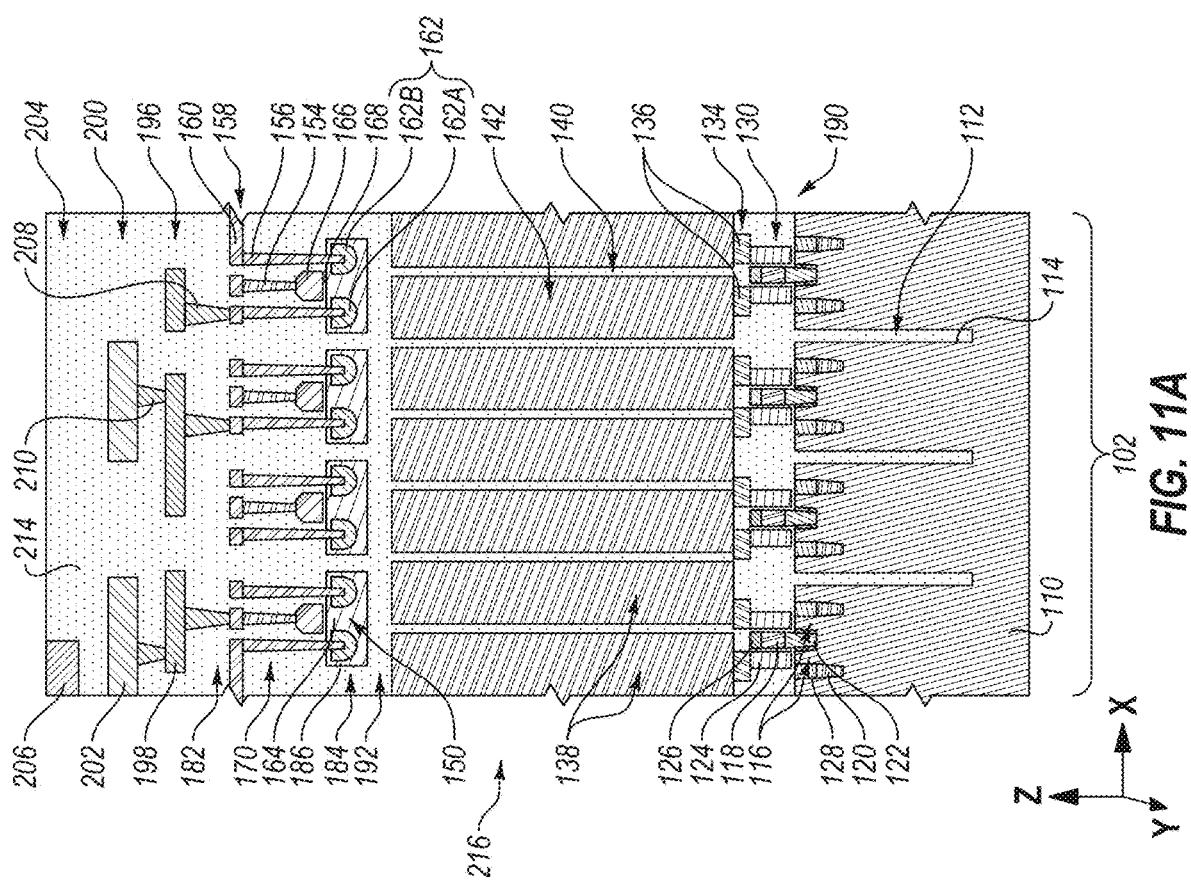
FIG. 11B
FIG. 11A

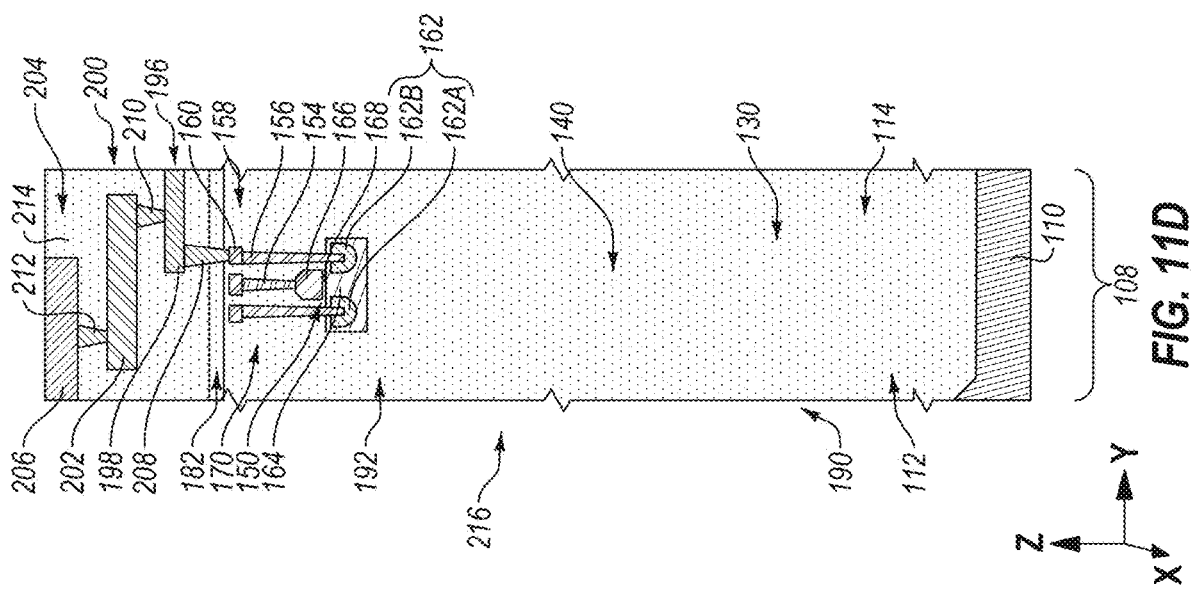
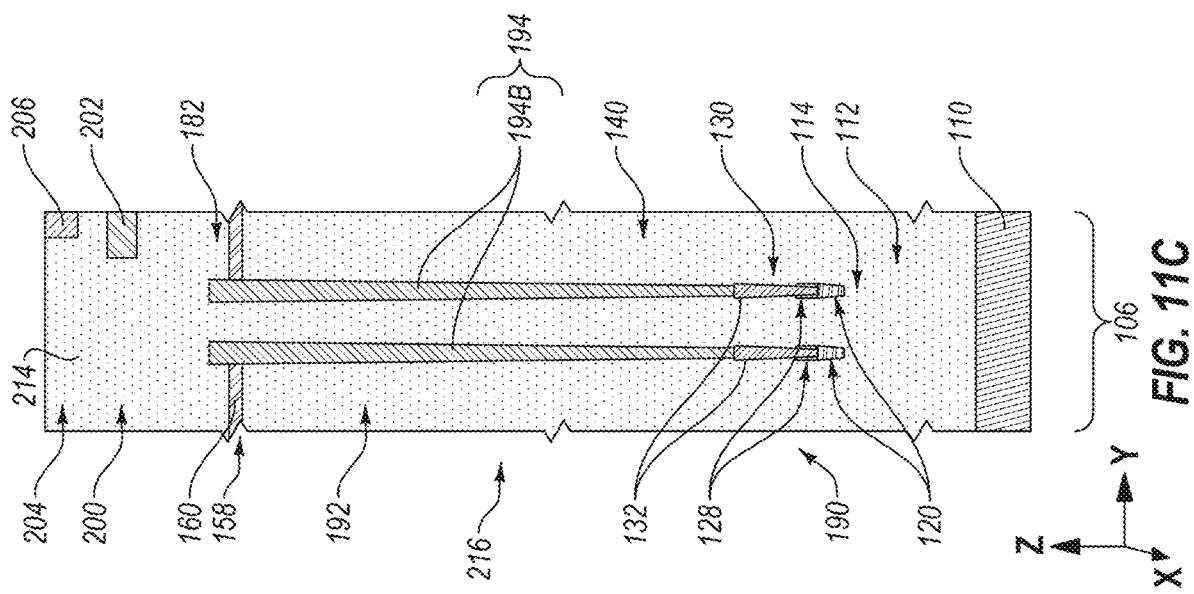

MICROELECTRONIC DEVICES AND ELECTRONIC SYSTEMS

CROSS-REFERENCE TO RELATED APPLICATIONS

This application is a divisional of U.S. Patent Application Ser. No. 17/364,379, filed Jun. 30, 2021, now U.S. Pat. No. 11,930,634, issued Mar. 12, 2024, which is related to U.S. patent application Ser. No. 17/364,281, filed Jun. 30, 2021, now U.S. U.S. Pat. No. 11,785,764, issued Oct. 10, 2023, listing Fatma Arzum Simsek-Ege, Kunal R. Parekh, Terrence B. McDaniel, and Beau D. Barry as inventors, for "METHODS OF FORMING MICROELECTRONIC DEVICES." This application is also related to U.S. patent application Ser. No. 17/364,335, filed Jun. 30, 2021, now U.S. Pat. No. 11,996,377, issued May 28, 2024, listing Fatma Arzum Simsek-Ege, Kunal R. Parekh, and Beau D. Barry as inventors, for "MICROELECTRONIC DEVICES AND ELECTRONIC SYSTEMS." This application is also related to U.S. patent application Ser. No. 17/364,377, filed Jun. 30, 2021, now U.S. Pat. No. 11,842,990, issued Dec. 12, 2023, listing Fatma Arzum Simsek-Ege and Kunal R. Parekh as inventors, for MICROELECTRONIC DEVICES AND ELECTRONIC SYSTEMS." This application is also related to U.S. patent application Ser. No. 17/364,429, filed Jun. 30, 2021, now U.S. Pat. No. 11,776,925, issued Oct. 3, 2023, listing Fatma Arzum Simsek-Ege as inventor, for "METHODS OF FORMING MICROELECTRONIC DEVICES, AND RELATED MICROELECTRONIC DEVICES AND ELECTRONIC SYSTEMS." This application is also related to U.S. patent application Ser. No. 17/364,476, filed Jun. 30, 2021, now U.S. Pat. No. 11,837,594, issued Dec. 5, 2023, listing Fatma Arzum Simsek-Ege and Kunal R. Parekh as inventors, for "MICROELECTRONIC DEVICES AND ELECTRONIC SYSTEMS." The disclosure of each of the foregoing documents is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices and memory devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, volatile memory devices. One type of volatile memory device is a dynamic random access memory (DRAM) device. A DRAM device may include a memory array including DRAM cells arranged in rows extending in a first horizontal direction and columns extending in a second horizontal direction. In one design configuration, an individual DRAM cell includes an access device (e.g., a transistor) and a storage node device (e.g., a capacitor) electrically connected to the access device. The DRAM cells of a DRAM device are electrically accessible through digit lines and word lines arranged along the rows and columns of the memory array and in electrical communication with control logic devices within a base control logic structure of the DRAM device.

Control logic devices within a base control logic structure underlying a memory array of a DRAM device have been used to control operations on the DRAM cells of the DRAM device. Control logic devices of the base control logic structure can be provided in electrical communication with digit lines and word lines coupled to the DRAM cells by way of routing and contact structures. Unfortunately, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the DRAM device.

BRIEF DESCRIPTION OF THE DRAWINGS

FIGS. 3A through 3D are simplified, partial longitudinal cross-sectional views of the array region (FIG. 3A), the digit line exit region (FIG. 3B), the word line exit region (FIG. 3C), and the socket region (FIG. 3D) shown in FIGS. 2A through 2D, respectively, at another processing stage of the method of forming the microelectronic device following the processing stage of FIGS. 2A through 2D.

FIGS. 4A through 4D are simplified, partial longitudinal cross-sectional views of the array region (FIG. 4A), the digit line exit region (FIG. 4B), the word line exit region (FIG. 4C), and the socket region (FIG. 4D) shown in FIGS. 2A through 2D, respectively, at another processing stage of the method of forming the microelectronic device following the processing stage of FIGS. 3A through 3D.

FIGS. 6A through 6D are simplified, partial longitudinal cross-sectional views of an array region (FIG. 6A), a digit line exit region (FIG. 6B), a word line exit region (FIG. 6C), and a socket region (FIG. 6D) of an additional microelectronic device structure, at another processing stage of the method of forming the microelectronic device.

FIGS. 7A through 7D are simplified, partial longitudinal cross-sectional views of the array region (FIG. 7A), the digit line exit region (FIG. 7B), the word line exit region (FIG. 7C), and the socket region (FIG. 7D) shown in FIGS. 6A through 6D, respectively, at another processing stage of the method of forming the microelectronic device following the processing stage of FIGS. 6A through 6D.

FIGS. 8A through 8D are simplified, partial longitudinal cross-sectional views of the array region (FIG. 8A), the digit line exit region (FIG. 8B), the word line exit region (FIG. 8C), and the socket region (FIG. 8D) shown in FIGS. 7A through 7D, respectively, at another processing stage of the method of forming the microelectronic device following the processing stage of FIGS. 7A through 7D.

FIGS. 9A through 9D are simplified, partial longitudinal cross-sectional views of the array region (FIG. 9A), the digit line exit region (FIG. 9B), the word line exit region (FIG. 9C), and the socket region (FIG. 9D) shown in FIGS. 2A through 2D, respectively, at another processing stage of the method of forming the microelectronic device following the processing stage of FIGS. 5A through 5D and the processing stage of FIGS. 8A through 8D.

FIGS. 10A through 10D are simplified, partial longitudinal cross-sectional views of the array region (FIG. 10A), the digit line exit region (FIG. 10B), the word line exit region (FIG. 10C), and the socket region (FIG. 10D) shown in FIGS. 2A through 2D, respectively, at another processing stage of the method of forming the microelectronic device following the processing stage of FIGS. 9A through 9D.

FIGS. 11A through 11D are simplified, partial longitudinal cross-sectional views of the array region (FIG. 11A), the digit line exit region (FIG. 11B), the word line exit region (FIG. 11C), and the socket region (FIG. 11D) shown in FIGS. 2A through 2D, respectively, at another processing stage of the method of forming the microelectronic device following the processing stage of FIGS. 10A through 10D.

DETAILED DESCRIPTION

Figure 1:
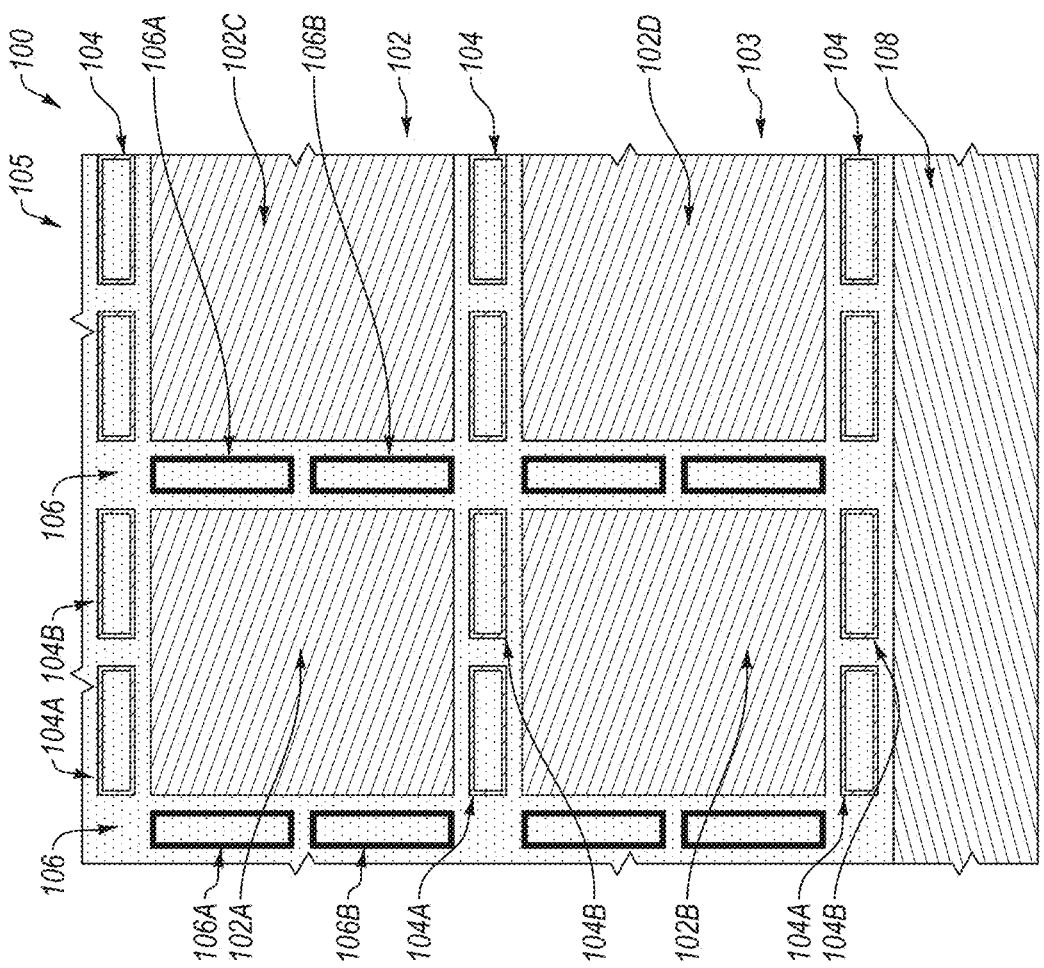
FIG. 1 is a simplified plan view of a microelectronic device structure at a processing stage of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory; conventional non-volatile memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe— and Ni-based alloy, a Co— and Ni-based alloy, an Fe— and Co-based alloy, a Co— and Ni— and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_x N_y$)), at least one dielectric oxycarbide material (e.g., silicon oxycarbide ($SiO_x C_y$)), at least one hydrogenated dielectric oxycarbide material (e.g., hydrogenated silicon oxycarbide ($SiC_x O_y H_z$)), and at least one dielectric carboxynitride material (e.g., a silicon carboxynitride ($SiO_x C_z N_y$)). Formulae including one or more of "x," "y," and "z" herein (e.g., $SiO_x$, $AlO_x$, $HfO_x$, $NbO_x$, $TiO_x$, $SiN_y$, $SiO_x N_y$, $SiO_x C_y$, $SiC_x O_y H_z$, $SiO_x C_z N_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1 through 12 are various views (described in further detail below) illustrating different processing stages of a method of forming a microelectronic device (e.g., a memory device, such as a DRAM device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device. With the description provided below, it will be readily apparent to one of ordinary skill in the art that the methods and structures described herein may be used to form various devices and electronic systems.

FIG. 1 shows a simplified plan view of a first microelectronic device structure 100 (e.g., a first wafer) at an early processing stage of a method of forming a microelectronic device (e.g., a memory device, such as a DRAM device), in accordance with embodiments of the disclosure. As shown in FIG. 1, the first microelectronic device structure 100 may be formed to include array regions 102, digit line exit regions 104 (also referred to as "digit line contact socket regions") interposed between pairs of the array regions 102 horizontally neighboring one another in a first horizontal direction (e.g., the Y-direction), word line exit regions 106 (also referred to as "word line contact socket regions") interposed between additional pairs of the array regions 102 horizontally neighboring one another in a second horizontal direction (e.g., the X-direction) orthogonal to the first horizontal direction, and one or more socket regions 108 (also referred to as "back end of line (BEOL) contact socket regions") horizontally neighboring some of the array regions 102 in one or more of the first horizontal direction and the second horizontal direction. The array regions 102, the digit line exit regions 104, the word line exit regions 106, and the socket regions 108 are each described in further detail below.

The array regions 102 of the first microelectronic device structure 100 may comprise horizontal areas of the first microelectronic device structure 100 configured and positioned to have arrays of memory cells (e.g., arrays of DRAM cells) subsequently formed within horizontal boundaries thereof, as described in further detail below. In addition, the array regions 102 may also be configured and positioned to have desirable arrangements of control logic devices subsequently formed within horizontal boundaries thereof, as also described in further detail below. The control logic devices tare to be formed within the horizontal boundaries of the array regions 102 may be formed to be vertically offset (e.g., in the Z-direction) from the memory cells to be formed within the horizontal boundaries of the array regions 102.

The first microelectronic device structure 100 may be formed to include a desired quantity of the array regions 102. For clarity and ease of understanding of the drawings and related description, FIG. 1 depicts the first microelectronic device structure 100 as being formed to include four (4) array regions 102: a first array region 102A, a second array region 102B, a third array region 102C, and a fourth array region 102D. As shown in FIG. 1, the second array region 102B may horizontally neighbor the first array region 102A in the Y-direction, and may horizontally neighbor the fourth array region 102D in the X-direction; the third array region 102C may horizontally neighbor the first array region 102A in the X-direction, and may horizontally neighbor the fourth array region 102D in the Y-direction; and the fourth array region 102D may horizontally neighbor the third array region 102C in the Y-direction, and may horizontally neighboring the second array region 102B in the Y-direction. In additional embodiments, the first microelectronic device structure 100 is formed to include a different number of array regions 102. For example, the first microelectronic device structure 100 may be formed to include greater than four (4) array regions 102, such as greater than or equal to eight (8) array regions 102, greater than or equal to sixteen (16) array regions 102, greater than or equal to thirty-two (32) array regions 102, greater than or equal to sixty-four (64) array regions 102, greater than or equal to one hundred twenty eight (128) array regions 102, greater than or equal to two hundred fifty six (256) array regions 102, greater than or equal to five hundred twelve (512) array regions 102, or greater than or equal to one thousand twenty-four (1024) array regions 102.

In addition, the first microelectronic device structure 100 may be formed to include a desired distribution of the array regions 102. As shown in FIG. 1, in some embodiments, the first microelectronic device structure 100 is formed to include rows 103 of the array regions 102 extending in the X-direction, and columns 105 of the array regions 102 extending in the Y-direction. The rows 103 of the array regions 102 may, for example, include a first row including the first array region 102A and the third array region 102C, and a second row including the second array region 102B and the fourth array region 102D. The columns 105 of the array regions 102 may, for example, include a first column including the first array region 102A and the second array region 102B, and a second column including the third array region 102C and the fourth array region 102D.

With continued reference to FIG. 1, the digit line exit regions 104 of the first microelectronic device structure 100 may comprise horizontal areas of the first microelectronic device structure 100 configured and positioned to have at least some subsequently formed digit lines (e.g., bit lines, data lines) horizontally terminate therein. For an individual digit line exit region 104, at least some subsequently formed digit lines operatively associated with the array regions 102 flanking (e.g., at opposing boundaries in the Y-direction) the digit line exit region 104 may have ends within the horizontal boundaries of the digit line exit region 104. In addition, the digit line exit regions 104 may also be configured and positioned to include contact structures and routing structures with the horizontal boundaries thereof that are operatively associated with at least some of the subsequently formed digit lines. As described in further detail below, some of the contact structures to be formed within the digit line exit regions 104 may couple the subsequently formed digit lines to control logic circuitry of control logic devices (e.g., sense amplifier (SA) devices) to subsequently be formed within the array regions 102. As shown in FIG. 1, in some embodiments, the digit line exit regions 104 horizontally extend in the X-direction, and are horizontally interposed between horizontally neighboring rows of the array regions 102 in the Y-direction. The digit line exit regions 104 may, for example, horizontally alternate with the rows of the array regions 102 in the Y-direction.

An individual digit line exit region 104 may be divided into multiple subregions. For example, as shown in FIG. 1, an individual digit line exit region 104 may include first digit line exit subregions 104A and second digit line exit subregions 104B. In some embodiments, the first digit line exit subregions 104A horizontally alternate with the second digit line exit subregions 104B in the X-direction. A pair (e.g., two (2)) of horizontally neighboring array regions 102 within an individual column of the array regions 102 may include one (1) of the first digit line exit subregions 104A and one (1) of the second digit line exit subregions 104B positioned horizontally therebetween in the Y-direction. By way of non-limiting example, the first array region 102A and the second array region 102B of a first column of the array regions 102 may include one (1) of the first digit line exit subregions 104A and one (1) of the second digit line exit subregions 104B positioned therebetween in the Y-direction. The one (1) of the first digit line exit subregions 104A and the one (1) of the second digit line exit subregions 104B may be at least partially (e.g., substantially) confined with horizontal boundaries in the X-direction of the first array region 102A and the second array region 102B.

As described in further detail below, an individual first digit line exit subregion 104A may be configured and positioned to facilitate electrical connections between a group of digit lines (e.g., odd digit lines or even digit lines) and a group of control logic devices (e.g., odd SA devices or even SA devices) operatively associated with a portion (e.g., a half portion in the X-direction) of one (1) array region 102 (e.g., the first array region 102A) of a pair of horizontally neighboring array regions 102, and to also facilitate electrical connections between a group of additional digit lines (e.g., additional odd digit lines or additional even digit lines) and a group of additional control logic devices (e.g., additional odd SA devices or additional even SA devices) operatively associated with a corresponding portion (e.g., a corresponding half portion in the X-direction) of an additional array region 102 (e.g., the second array region 102B) of the pair of horizontally neighboring array regions 102. In addition, as also described in further detail below, an individual second digit line exit subregion 104B may be configured and positioned to facilitate electrical connections between a group of further digit lines and a group of further control logic devices operatively associated with another portion (e.g., another half portion in the X-direction) of the one (1) array region 102 (e.g., the first array region 102A), and to also facilitate electrical connections between a group of yet further digit lines and a group of yet further control logic devices operatively associated with a corresponding another portion (e.g., a corresponding another half portion in the X-direction) of the additional array region 102 (e.g., the second array region 102B).

Still referring to FIG. 1, the word line exit regions 106 of the first microelectronic device structure 100 may comprise horizontal areas of the first microelectronic device structure 100 configured and positioned to have at least some subsequently formed word lines (e.g., access lines) horizontally terminate therein. For an individual word line exit region 106, at least some subsequently formed word lines operatively associated with the array regions 102 flanking (e.g., at opposing boundaries in the X-direction) the word line exit region 106 may have ends within the horizontal boundaries of the word line exit region 106. In addition, the word line exit regions 106 may also be configured and positioned to include contact structures and routing structures within the horizontal boundaries thereof that are operatively associated with the subsequently formed word lines. As described in further detail below, some of the contact structures to be formed within the word line exit regions 106 may couple the subsequently formed word lines to control logic circuitry of additional control logic devices (e.g., sub-word line driver (SWD) devices) to subsequently be formed within the array regions 102. As shown in FIG. 1, in some embodiments, the word line exit regions 106 horizontally extend in the Y-direction, and are horizontally interposed between horizontally neighboring columns of the array regions 102 in the X-direction. The word line exit regions 106 may, for example, horizontally alternate with the columns of the array regions 102 in the X-direction.

An individual word line exit region 106 may be divided into multiple subregions. For example, as shown in FIG. 1, an individual word line exit region 106 may include first word line exit subregions 106A and second word line exit subregions 106B. In some embodiments, the first word line exit subregions 106A horizontally alternate with the second word line exit subregions 106B in the Y-direction. A pair (e.g., two (2)) of horizontally neighboring array regions 102 within an individual row of the array regions 102 may include one (1) of the first word line exit subregions 106A and one (1) of the second word line exit subregions 106B positioned horizontally therebetween in the X-direction. By way of non-limiting example, the first array region 102A and the third array region 102C of a first row of the array regions 102 may include one (1) of the first word line exit subregions 106A and one (1) of the second word line exit subregions 106B positioned therebetween in the X-direction. The one (1) of the first word line exit subregions 106A and the one (1) of the second word line exit subregions 106B may be at least partially (e.g., substantially) confined with horizontal boundaries in the Y-direction of the first array region 102A and the third array region 102C.

As described in further detail below, an individual first word line exit subregion 106A may be configured and positioned to facilitate electrical connections between a group of word lines (e.g., odd word lines or even word lines) and a group of control logic devices (e.g., odd SWD devices or even SWD devices) operatively associated with a portion (e.g., a half portion in the Y-direction) of one (1) array region 102 (e.g., the first array region 102A) of a pair of horizontally neighboring array regions 102, and to also facilitate electrical connections between a group of additional word lines (e.g., additional odd word lines or additional even word lines) and a group of additional control logic devices (e.g., additional odd SWD devices or additional even SWD devices) operatively associated with a corresponding portion (e.g., a corresponding half portion in the Y-direction) of a further array region 102 (e.g., the third array region 102C) of the pair of horizontally neighboring array regions 102. In addition, as also described in further detail below, an individual second word line exit subregion 106B may be configured and positioned to facilitate electrical connections between a group of further word lines and a group of further control logic devices operatively associated with another portion (e.g., another half portion in the Y-direction) of the one (1) array region 102 (e.g., the first array region 102A), and to also facilitate electrical connections between a group of yet further word lines and a group of yet further control logic devices operatively associated with a corresponding another portion (e.g., a corresponding another half portion in the Y-direction) of the further array region 102 (e.g., the third array region 102C).

With continued reference to FIG. 1, the socket regions 108 of the first microelectronic device structure 100 may comprise horizontal areas of the first microelectronic device structure 100 configured and positioned to facilitate electrical connections (e.g., by way of contact structures and routing structures formed within horizontal boundaries thereof) between subsequently formed control logic circuitry and additional subsequently formed structures (e.g., BEOL structures), as described in further detail below. The socket regions 108 may horizontally neighbor one or more peripheral horizontal boundaries (e.g., in the Y-direction, in the X-direction) of one or more groups of the array regions 102. For clarity and ease of understanding of the drawings and related description, FIG. 1 depicts the first microelectronic device structure 100 as being formed to include one (1) socket region 108 horizontally neighboring a shared horizontal boundary of the second array region 102B and the fourth array region 102D. However, the first microelectronic device structure 100 may be formed to include one or more of a different quantity and a different horizontal position of socket region(s) 108. As a non-limiting example, the socket region 108 may horizontally neighbor a shared horizontal boundary of a different group of the array regions 102 (e.g., a shared horizontal boundary of the third array region 102C and the fourth array region 102D, a shared horizontal boundary of the first array region 102A and the third array region 102C, a shared horizontal boundary of the first array region 102A and the second array region 102B). As another non-limiting example, the first microelectronic device structure 100 may be formed to include multiple (e.g., a plurality of, more than one) socket regions 108 horizontally neighboring different groups of the array regions 102 than one another. In some embodiments, multiple socket regions 108 collectively substantially horizontally surround (e.g., substantially horizontally circumscribe) the array regions 102.

Figure 2B:
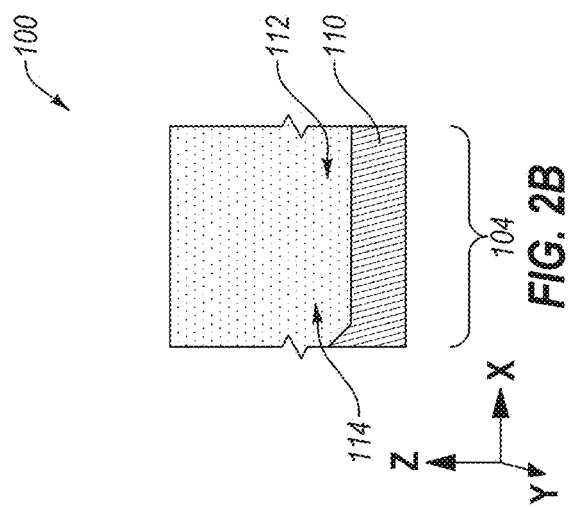
FIGS. 2A through 2D are simplified, partial longitudinal cross-sectional views of an array region (FIG. 2A), a digit line exit region (FIG. 2B), a word line exit region (FIG. 2C), and a socket region (FIG. 2D) of the microelectronic device structure shown in FIG. 1 at the processing stage of FIG. 1.
Figure 2A:
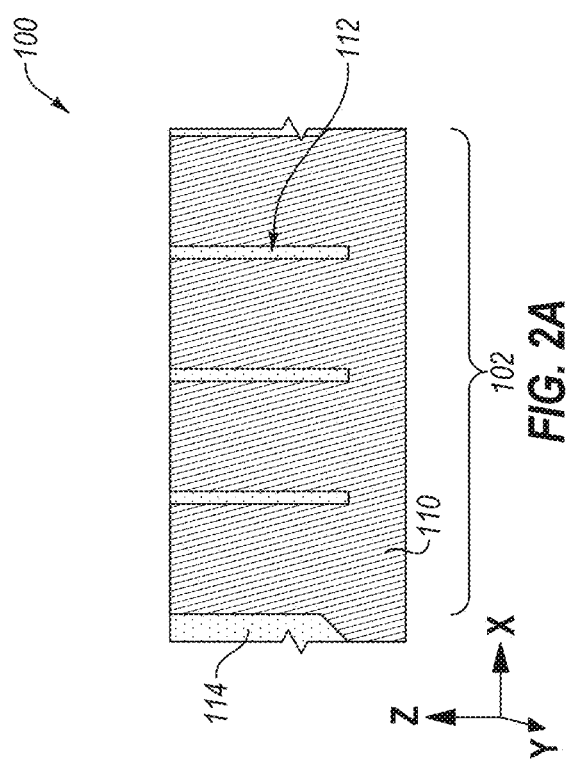
Figure 2C:
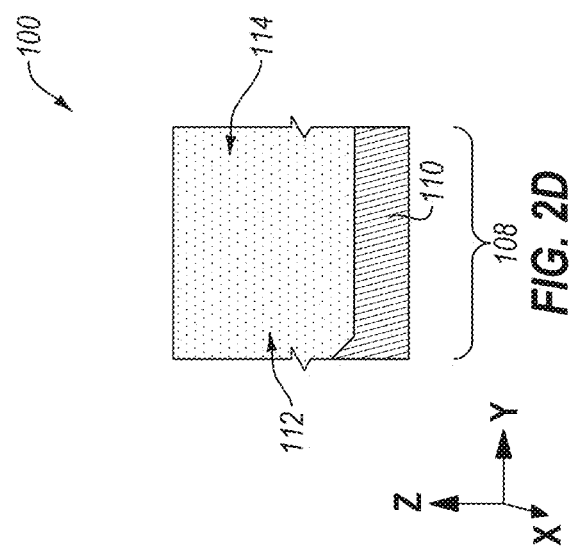
Figure 2D:
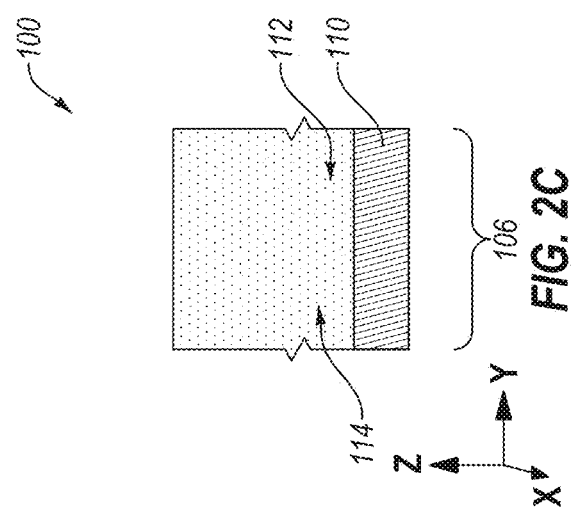

FIGS. 2A through 2D illustrate simplified, partial longitudinal cross-sectional views of different regions of the first microelectronic device structure 100 previously described with reference to FIG. 1. FIG. 2A illustrates a simplified, partial longitudinal cross-sectional view from the perspective of the Y-direction (so as to depict an XZ-plane) of one of the array regions 102 (e.g., the first array region 102A) of the first microelectronic device structure 100 shown in FIG. 1. FIG. 2B illustrates a simplified, partial longitudinal cross-sectional view from the perspective of the Y-direction (so as to depict an XZ-plane) of one of the digit line exit regions 104 of the first microelectronic device structure 100 shown in FIG. 1. FIG. 2C illustrates a simplified, partial longitudinal cross-sectional view from the perspective of the X-direction (so as to depict an YZ-plane) of one of the word line exit regions 106 of the first microelectronic device structure 100 shown in FIG. 1. FIG. 2D illustrates a simplified, partial longitudinal cross-sectional view from the perspective of the X-direction (so as to depict an YZ-plane) of one of socket regions 108 of the first microelectronic device structure 100 shown in FIG. 1.

Referring collectively to FIGS. 2A through 2D, the first microelectronic device structure 100 may be formed to include a first base semiconductor structure 110, filled trenches 112, and a first isolation material 114. The filled trenches 112 vertically extend (e.g., in the Z-direction) into the first base semiconductor structure 110. The first isolation material 114 covers and surrounds surfaces of the first base semiconductor structure 110.

The first base semiconductor structure 110 comprises a base material or construction upon which additional features (e.g., materials, structures, devices) of the first microelectronic device structure 100 are formed. The first base semiconductor structure 110 may comprise a semiconductor structure (e.g., a semiconductor wafer), or a base semiconductor material on a supporting structure. For example, the first base semiconductor structure 110 may comprise a conventional silicon substrate (e.g., a conventional silicon wafer), or another bulk substrate comprising a semiconductor material. In some embodiments, the first base semiconductor structure 110 comprises a silicon wafer. The first base semiconductor structure 110 may include one or more layers, structures, and/or regions formed therein and/or thereon.

The filled trenches 112 may comprise trenches (e.g., openings, vias, apertures) within the first base semiconductor structure 110 that are at least partially (e.g., substantially) filled with the first isolation material 114. The filled trenches 112 may, for example, be employed as shallow trench isolation (STI) structures within the first base semiconductor structure 110. The filled trenches 112 may be formed to vertically extend partially (e.g., less than completely) through the first base semiconductor structure 110. Each of the filled trenches 112 may be formed to exhibit substantially the same dimensions and shape as each other of the filled trenches 112, or at least one of the filled trenches 112 may be formed to exhibit one or more of different dimensions and a different shape than at least one other of the filled trenches 112. As a non-limiting example, each of the filled trenches 112 may be formed to exhibit substantially the same vertical dimension(s) and substantially the same vertical cross-sectional shape(s) as each other of the filled trenches 112; or at least one of the filled trenches 112 may be formed to exhibit one or more of different vertical dimension(s) and different vertical cross-sectional shape(s) than at least one other of the filled trenches 112. In some embodiments, the filled trenches 112 are all formed to vertically extend to and terminate at substantially the same depth within the first base semiconductor structure 110. In additional embodiments, at least one of the filled trenches 112 is formed to vertically extend to and terminate at a relatively deeper depth within the first base semiconductor structure 110 than at least one other of the filled trenches 112. As another non-limiting example, each of the filled trenches 112 may be formed to exhibit substantially the same horizontal dimension(s) and substantially the same horizontal cross-sectional shape(s) as each other of the filled trenches 112; or at least one of the filled trenches 112 may be formed to exhibit one or more of different horizontal dimension(s) (e.g., relatively larger horizontal dimension(s), relatively smaller horizontal dimension(s)) and different horizontal cross-sectional shape(s) than at least one other of the filled trenches 112. In some embodiments, at least one of the filled trenches 112 is formed to have one or more different horizontal dimensions (e.g., in the X-direction and/or in the Y-direction) than at least one other of the filled trenches 112.

The first isolation material 114 may be formed of and include at least one insulative material. By way of non-limiting example, the first isolation material 114 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first isolation material 114 is formed of and includes $SiO_x$ (e.g., $SiO_2$). The first isolation material 114 may be substantially homogeneous, or the first isolation material 114 may be heterogeneous. In some embodiments, the first isolation material 114 is substantially homogeneous. In additional embodiments, the first isolation material 114 is heterogeneous. The first isolation material 114 may, for example, be formed of and include a stack of at least two different dielectric materials.

Figure 3B:
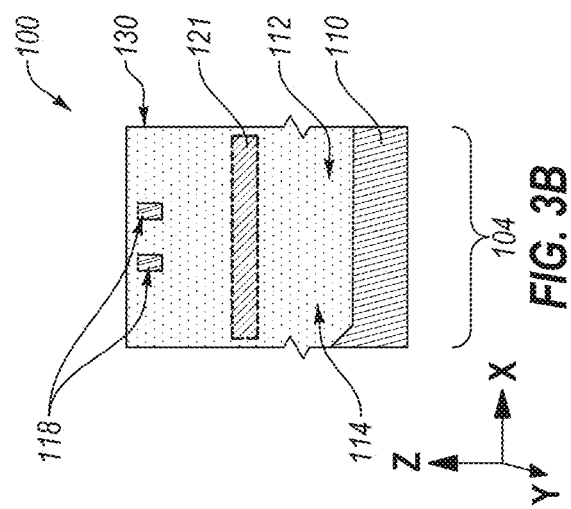
Figure 3A:
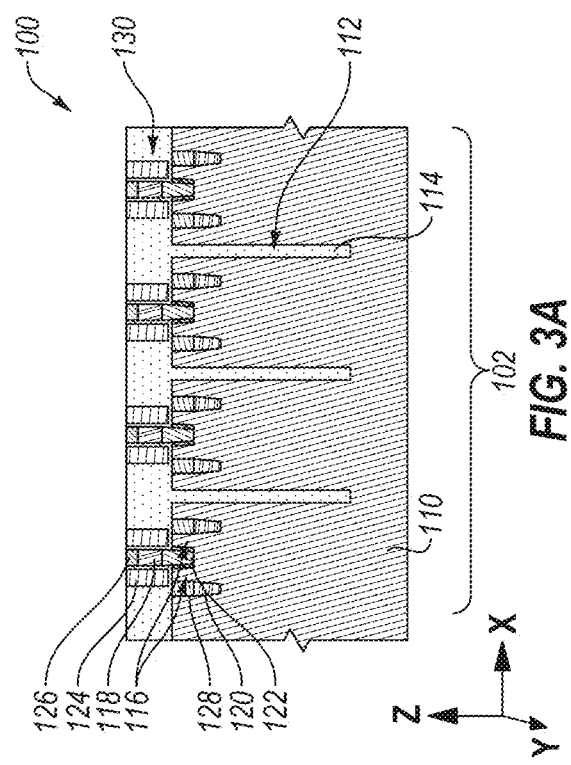

Referring next to FIGS. 3A through 3D, illustrated are simplified, partial longitudinal cross-sectional views, from the directional perspectives previously described, of the array region 102 (FIG. 3A), the digit line exit region 104 (FIG. 3B), the word line exit region 106 (FIG. 3C), and the socket region 108 (FIG. 3D) at a processing stage of the method of forming the microelectronic device following the processing stage previously described with reference to FIGS. 1 and 2A through 2D. As collectively depicted in FIGS. 3A through 3D, access devices 116 (FIG. 3A) (e.g., access transistors) may be formed within the array region 102 (FIG. 3A). In addition, digit lines 118 (FIGS. 3A and 3B) (e.g., data lines, bit lines) may be formed to be coupled to the access devices 116 (FIG. 3A) and to horizontally extend in the Y-direction through the array region 102 (FIG. 3A). At least some of the digit lines 118 (FIGS. 3A and 3B) may terminate (e.g., end) within the digit line exit region 104 (FIG. 3B). Furthermore, word lines 120 (e.g., access lines) may be formed to be coupled to the access devices 116 (FIG. 3A) and to horizontally extend in the X-direction through the array region 102 (FIG. 3A). At least some of the word lines 120 (FIGS. 3A and 3C) may terminate within the word line exit region 106 (FIG. 3C).

Referring to FIG. 3A, the access devices 116 formed within the array region 102 may be employed as components of memory cells (e.g., DRAM cells) to be formed within the array region 102. By way of non-limiting example, each access device 116 may individually be formed to include a channel region comprising a portion of the first base semiconductor structure 110; a source region and a drain region each individually comprising one or more of at least one conductively doped portion of the first base semiconductor structure 110 and/or at least one conductive structure formed in, on, or over the first base semiconductor structure 110; and at least one gate structure comprising a portion of at least one of the word lines 120. Each access device 116 may also include a gate dielectric material (e.g., a dielectric oxide material) formed to be interposed between the channel region thereof and the gate structure thereof.

The digit lines 118 may exhibit horizontally elongate shapes extending in parallel in the Y-direction; and the word lines 120 may exhibit horizontally elongate shapes extending in parallel in the X-direction orthogonal to the Y-direction. As used herein, the term "parallel" means substantially parallel. The digit lines 118 and the word lines 120 may each individually be formed of and include conductive material. By way of non-limiting example, the digit lines 118 and the word lines 120 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit lines 118 and the word lines 120 are each individually formed of and include one or more of W, Ru, Mo, and titanium nitride ($TiN_y$). Each of the digit lines 118 and each of the word lines 120 may individually be substantially homogeneous, or one or more of the digit lines 118 and/or one or more of the word lines 120 may individually be substantially heterogeneous. In some embodiments, each of the digit lines 118 and each of the word lines 120 are formed to be substantially homogeneous.

Still referring to FIG. 3A, within the array region 102, additional features (e.g., structures, materials) are also formed on, over, and/or between the access devices 116, the digit lines 118, and the word lines 120. For example, as shown in FIG. 3A, first contact structures 122 (e.g., digit line contact structures, also referred to as so-called "bitcon" structures) may be formed to vertically extend between and couple the access devices 116 to the digit lines 118; second contact structures 124 (e.g., cell contact structures, also referred to as so-called "cellcon" structures) may be formed in contact with the access devices 116 and may configured and positioned to couple the access devices 116 to subsequently formed storage node devices (e.g., capacitors); dielectric cap structures 126 may be formed on or over the digit lines 118; and additional dielectric cap structures 128 may be formed on or over the word lines 120. In addition, dielectric structures (e.g., dielectric spacers, such as low-k dielectric spacers formed of and including one or more low-k dielectric materials) may be formed to intervene (e.g., horizontally intervene) between and isolate the second contact structures 124 and digit lines 118; and further dielectric structures (e.g., gate dielectric structures, such as gate dielectric oxide structures) may be formed to intervene (e.g., horizontally intervene) between and isolate the first contact structures 122 and the word lines 120.

The first contact structures 122 and the second contact structures 124 may individually be formed of and include at least one conductive material. In some embodiments, the first contact structures 122 and the second contact structures 124 are individually formed of and include one or more of at least one metal (e.g., W), at least one alloy, at least one conductive metal silicide (e.g., one or more of titanium silicide ($TiSi_x$), cobalt silicide ($CoSi_x$), tungsten silicide ($WSi_x$), tantalum silicide ($TaSi_x$), molybdenum silicide ($MoSi_x$), and nickel silicide ($NiSi_x$)), and at least one conductive metal nitride (e.g., one or more of $TiN_y$, tungsten nitride ($WN_y$), tantalum nitride ($TaN_y$), cobalt nitride ($CoN_y$), molybdenum nitride ($MoN_y$), and nickel nitride ($NiN_y$)). In addition, the dielectric cap structures 126 and the additional dielectric cap structures 128 may individually be formed of and include at least one insulative material. In some embodiments, the dielectric cap structures 126 and the additional dielectric cap structures 128 are individually formed of and include a dielectric nitride material (e.g., $SiN_y$, such as $Si_3N_4$).

Referring to FIG. 3B, within the digit line exit region 104, at least some of the digit lines 118 may horizontally terminate (e.g., end) in the Y-direction. Each of the digit lines 118 horizontally extending through the array region 102 (FIG. 3A) and horizontally terminating within the digit line exit region 104 may be formed to terminate at substantially the same horizontal position in the Y-direction; or at least one of the digit lines 118 horizontally terminating within the digit line exit region 104 may be formed to terminate at a different horizontal position in the Y-direction within the digit line exit region 104 than at least one other of the digit lines 118 horizontally terminating within the digit line exit region 104. In some embodiments, at least some digit lines 118 horizontally neighboring one another in the X-direction have terminal ends (e.g., terminal surfaces) horizontally offset from one another in the Y-direction. Horizontally offsetting the terminal ends of some of the digit lines 118 from the terminal ends of some other of the digit lines 118 within the digit line exit region 104 may, for example, promote or facilitate desirable contact structure arrangements within the digit line exit region 104.

As shown in FIG. 3B, within the digit line exit region 104, dummy word lines 121 may, optionally, be formed vertically below the digit lines 118. If formed, the dummy word lines 121 may be formed at substantially the same vertical position (e.g., vertical elevation) within the first microelectronic device structure 100 (e.g., within the first base semiconductor structure 110 thereof) as the word lines 120 (FIGS. 3A and 3C), and may be formed to horizontally extend orthogonal to the digit lines 118 (e.g., in the X-direction). A material composition of the dummy word lines 121 may be substantially the same as a material composition of the word lines 120 (FIGS. 3A and 3C). If formed, the dummy word lines 121 may be electrically isolated from one another and other components (e.g., the word lines 120 (FIGS. 3A and 3C), the digit lines 118) of the first microelectronic device structure 100. The dummy word lines 121 (if any) within the digit line exit region 104 may not be employed as part of data paths during use and operation of a microelectronic device formed through the methods of the disclosure. In additional embodiments, the dummy word lines 121 are absent (e.g., omitted) from the digit line exit region 104.

Referring next to FIG. 3C, within the word line exit region 106, at least some of the word lines 120 may horizontally terminate (e.g., end) in the X-direction. Each of the word lines 120 horizontally extending through the array region 102 (FIG. 3A) and horizontally terminating within the word line exit region 106 may be formed to terminate at substantially the same horizontal position in the X-direction; or at least one of the word lines 120 horizontally terminating within the word line exit region 106 may be formed to terminate at a different horizontal position in the X-direction within the word line exit region 106 than at least one other of the word lines 120 horizontally terminating within the word line exit region 106. In some embodiments, at least some word lines 120 horizontally neighboring one another in the Y-direction have terminal ends (e.g., terminal surfaces) horizontally offset from one another in the X-direction. Horizontally offsetting the terminal ends of some of the word lines 120 from the terminal ends of some other of the word lines 120 within the word line exit region 106 may, for example, promote or facilitate desirable contact structure arrangements within the word line exit region 106.

As shown in FIG. 3C, within the word line exit region 106, dummy digit lines 119 may, optionally, be formed vertically above the word lines 120. If formed, the dummy digit lines 119 may be formed at substantially the same vertical position (e.g., vertical elevation) within the first microelectronic device structure 100 (e.g., within the second isolation material 130 thereof) as the digit lines 118 (FIGS. 3A and 3B), and may be formed to horizontally extend orthogonal to the word lines 120 (e.g., in the Y-direction). A material composition of the dummy digit lines 119 may be substantially the same as a material composition of the digit lines 118 (FIGS. 3A and 3B). If formed, the dummy digit lines 119 may be electrically isolated from one another and the other components (e.g., the digit lines 118 (FIGS. 3A and 3B), the word lines 120) of the first microelectronic device structure 100. The dummy digit lines 119 (if any) within the word line exit region 106 may not be employed as part of data paths during use and operation of a microelectronic device formed through the methods of the disclosure. In additional embodiments, the dummy digit lines 119 are absent (e.g., omitted) from the word line exit region 106.

Referring collectively to FIGS. 3A through 3D, the second isolation material 130 may be formed on or over portions of at least the first base semiconductor structure 110, the access devices 116 (FIG. 3A), the digit lines 118 (FIGS. 3A and 3B), the word lines 120 (FIGS. 3A and 3C), the second contact structures 124, and the first isolation material 114. The second isolation material 130 may be formed of and include at least one insulative material. A material composition of second isolation material 130 may be substantially the same as a material composition of the first isolation material 114, or the material composition of the second isolation material 130 may be different than the material composition of the first isolation material 114. In some embodiments, the second isolation material 130 is formed of and includes a dielectric oxide material, such as $SiO_x$ (e.g., $SiO_2$). The second isolation material 130 may be substantially homogeneous, or the second isolation material 130 may be heterogeneous. In some embodiments, the second isolation material 130 is substantially homogeneous. In additional embodiments, the second isolation material 130 is heterogeneous. The second isolation material 130 may, for example, be formed of and include a stack of at least two different dielectric materials.

Referring next to FIGS. 4A through 4D, illustrated are simplified, partial longitudinal cross-sectional views, from the directional perspectives previously described, of the array region 102 (FIG. 4A), the digit line exit region 104 (FIG. 4B), the word line exit region 106 (FIG. 4C), and the socket region 108 (FIG. 4D) at a processing stage of the method of forming the microelectronic device following the processing stage previously described with reference to FIGS. 3A through 3D. As shown in FIG. 4C, third contact structures 132 may be formed within at least the word line exit region 106 (FIG. 4C). The third contact structures 132 may be formed to vertically extend (e.g., in the Z-direction) to and contact at least some of the word lines 120 horizontally extending (e.g., in the X-direction) into the word line exit region 106. The third contact structures 132 may be considered to be word line contact structures (e.g., a so-called "edge of array" word line contact structures).

Referring to FIG. 4C, within the word line exit region 106, individual third contact structures 132 may be formed to be coupled to individual word lines 120. Each third contact structure 132 may be formed to physically contact an individual word line 120. For example, within the word line exit region 106, each third contact structure 132 may be formed to vertically extend through each of the second isolation material 130 and a portion of the first isolation material 114, and to physically contact one of the word lines 120. Each third contact structure 132 may individually be formed to vertically terminate on, within, or below one of the word lines 120. In some embodiments, each third contact structure 132 is individually formed to terminate at an upper surface of one of the word lines 120, such that the third contact structure 132 is located on (e.g., physically contacts) the upper surface of the word line 120. In additional embodiments, each of third contact structures 132 is individually formed to terminate within one of the word lines 120, such that a lower boundary of the third contact structure 132 is positioned within vertical boundaries (e.g., between an upper boundary and a lower boundary) of the word line 120. In further embodiments, each of third contact structures 132 is individually formed to terminate below one of the word lines 120, such that a lower boundary of the third contact structure 132 is positioned below a lower boundary of the word line 120. Outer sidewalls of each third contact structure 132 may physically contact inner sidewalls of an individual word line 120.

The third contact structures 132 may be formed of and include conductive material. By way of non-limiting example, the third contact structures 132 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third contact structures 132 are each individually formed of and include W. Each of the third contact structures 132 may be substantially homogeneous, or one or more of the third contact structures 132 may individually be heterogeneous. In some embodiments, each of the third contact structures 132 is substantially homogeneous. In additional embodiments, each of the third contact structures 132 is heterogeneous. Each third contact structure 132 may, for example, be formed of and include a stack of at least two different conductive materials.

Figure 5B:
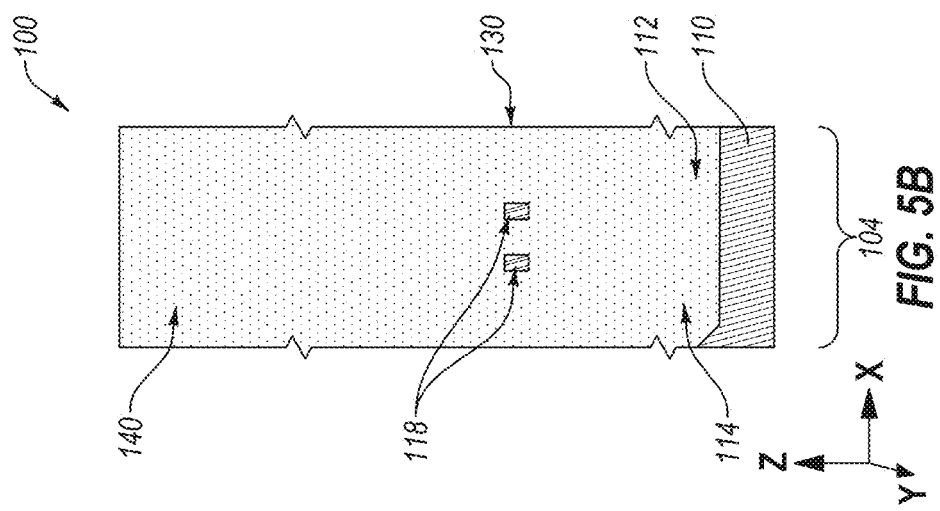
FIGS. 5A through 5D are simplified, partial longitudinal cross-sectional views of the array region (FIG. 5A), the digit line exit region (FIG. 5B), the word line exit region (FIG. 5C), and the socket region (FIG. 5D) shown in FIGS. 2A through 2D, respectively, at another processing stage of the method of forming the microelectronic device following the processing stage of FIGS. 4A through 4D.
Figure 5A:
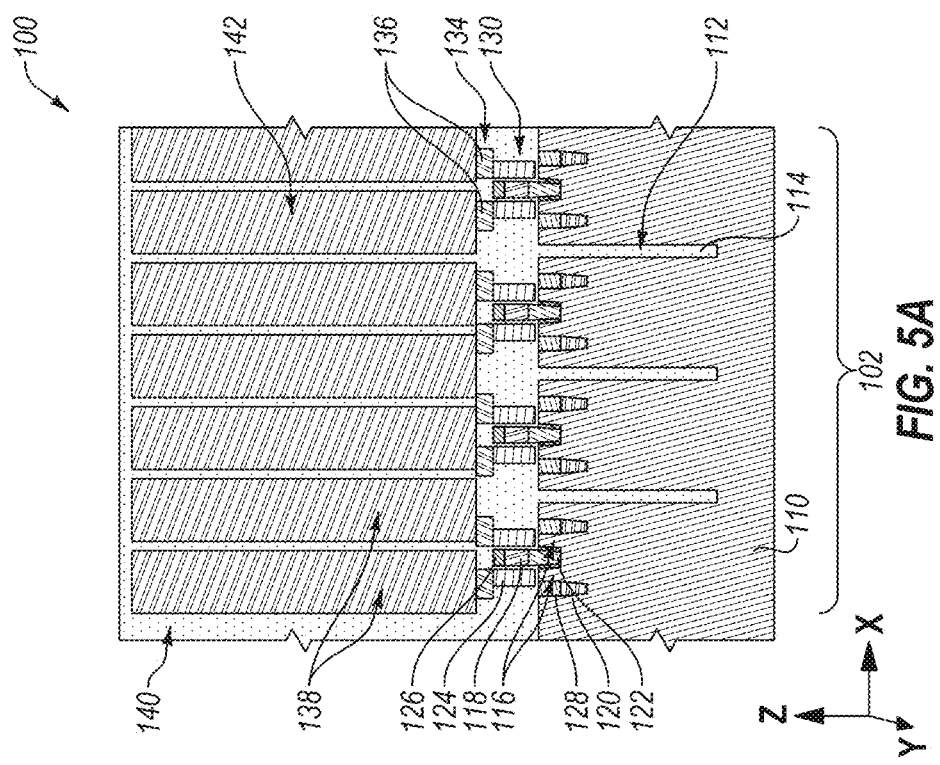
Figure 5C:
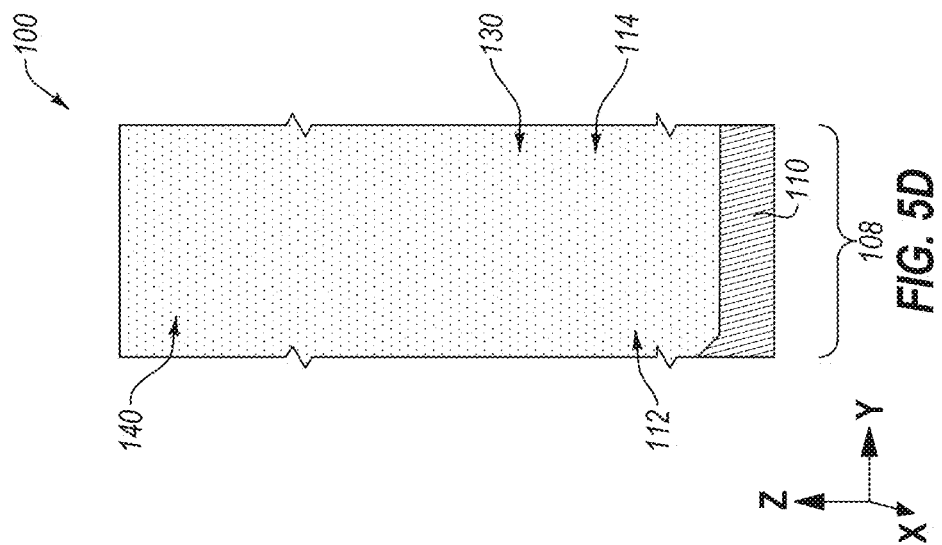

Referring next to FIGS. 5A through 5D, illustrated are simplified, partial longitudinal cross-sectional views, from the directional perspectives previously described, of the array region 102 (FIG. 5A), the digit line exit region 104 (FIG. 5B), the word line exit region 106 (FIG. 5C), and the socket region 108 (FIG. 5D) at a processing stage of the method of forming the microelectronic device following the processing stage previously described with reference to FIGS. 4A through 4D. As collectively depicted in FIGS. 5A through 5D, at least one first routing tier 134 including first routing structures 136 may be formed over the access devices 116 (FIG. 5A); storage node devices 138 (e.g., capacitors) may be formed over and in electrical communication with at least some of the first routing structures 136 within the array region 102 (FIG. 5A); and a third isolation material 140 may be formed on or over portions of at least the second isolation material 130, the first routing structures 136 (FIG. 5A), and the storage node devices 138 (FIG. 5A).

Referring to FIG. 5A, the first routing structures 136 of the first routing tier 134 may be employed to facilitate electrical communication between additional features (e.g., structures, materials, devices) coupled thereto. The first routing structures 136 may each individually be formed of and include conductive material. By way of non-limiting example, the first routing structures 136 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 136 are formed of and include W.

At least some of the first routing structures 136 may be formed and configured to couple the access devices 116 (e.g., access devices) to the storage node devices 138 (e.g., capacitors) to form memory cells 142 (e.g., DRAM cells) within the array region 102. Each memory cell 142 may individually include one of the access devices 116; one of the storage node devices 138; one of the second contact structures 124 interposed between the access device 116 and the storage node device 138; and one of the first routing structures 136 interposed between the second contact structure 124 and the storage node device 138. At least some of the first routing structures 136 within the array region 102 may, for example, be configured and employed as redistribution material (RDM) structures (also referred to as "redistribution layer" (RDL) structures) to effectively shift (e.g., stagger, adjust, modify) lateral positions of semiconductor pillars of the access devices 116 to accommodate a desired arrangement (e.g., a hexagonal close packed arrangement) of the storage node devices 138 vertically over and in electrical communication with the access devices 116.

Figure 5D:
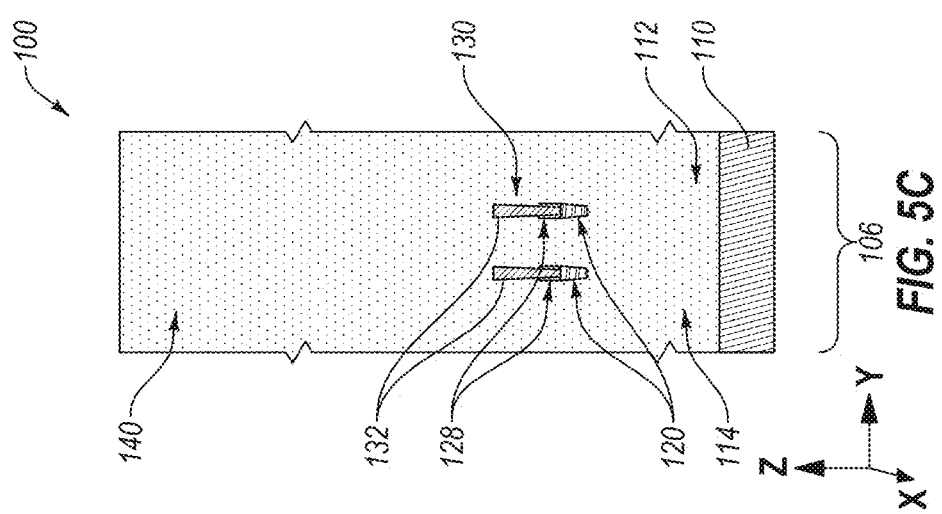

While FIG. 5A shows the formation of a single (e.g., only one) first routing tier 134 including first routing structures 136, multiple (e.g., more than one) first routing tiers 134 each individually including a desired arrangement (e.g., pattern) of first routing structures 136 may be formed. By of non-limiting example, two or more (e.g., three or more) of the first routing tiers 134 may be formed, wherein different first routing tiers 134 are vertically offset from one another and each individually include a desired arrangement of first routing structures 136 therein. At least some of the first routing structures 136 within at least one of the first routing tiers 134 may be coupled to at least some of the first routing structures 136 within at least one other of the first routing tiers 134 by way of conductive interconnect structures. In addition, while FIGS. 5A through 5D show the first routing structures 136 of the first routing tier 134 as only being formed within the array region 102 (FIG. 5A), the disclosure is not so limited. Rather, at least some of the first routing structures 136 of the first routing tier 134 may be formed to be at least partially positioned within one or more other regions of the first microelectronic device structure 100, such as within the socket region 108 (FIG. 5D).

Still referring to FIG. 5A, within the array region 102, the storage node devices 138 may individually be formed and configured to store a charge representative of a programmable logic state of the memory cell 142 including the storage node device 138. In some embodiments, the storage node devices 138 comprise capacitors. During use and operation, a charged capacitor may represent a first logic state, such as a logic 1; and an uncharged capacitor may represent a second logic state, such as a logic 0. Each of the storage node devices 138 may, for example, be formed to include a first electrode (e.g., a bottom electrode), a second electrode (e.g., a top electrode), and a dielectric material between the first electrode and the second electrode.

With collective reference to FIGS. 5A through 5D, the third isolation material 140 may be formed of and include at least one insulative material. A material composition of the third isolation material 140 may be substantially the same as a material composition of the second isolation material 130, or the material composition of the third isolation material 140 may be different than the material composition of the second isolation material 130. In some embodiments, the third isolation material 140 is formed of and includes a dielectric oxide material, such as $SiO_x$ (e.g., $SiO_2$). The third isolation material 140 may be substantially homogeneous, or the third isolation material 140 may be heterogeneous. In some embodiments, the third isolation material 140 is substantially homogeneous. In additional embodiments, the third isolation material 140 is heterogeneous. The third isolation material 140 may, for example, be formed of and include a stack of at least two different dielectric materials. As shown in FIGS. 5A through 5D, an upper surface of third isolation material 140 may be formed to be substantially planar and to vertically overlie upper surfaces of the storage node devices 138.

Figure 6D:
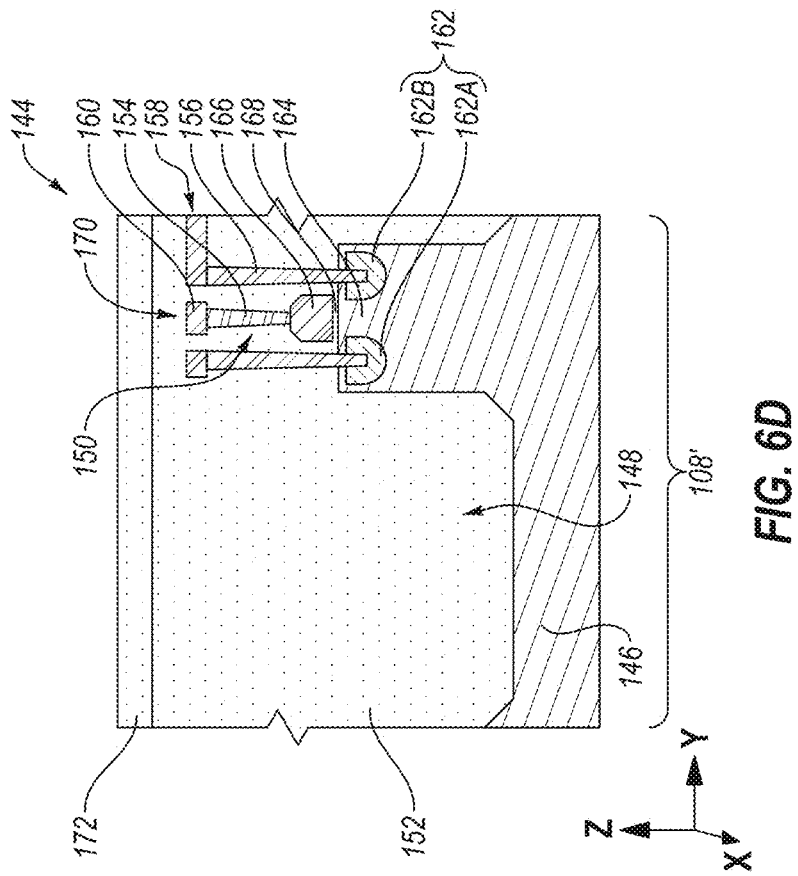
Figure 6C:
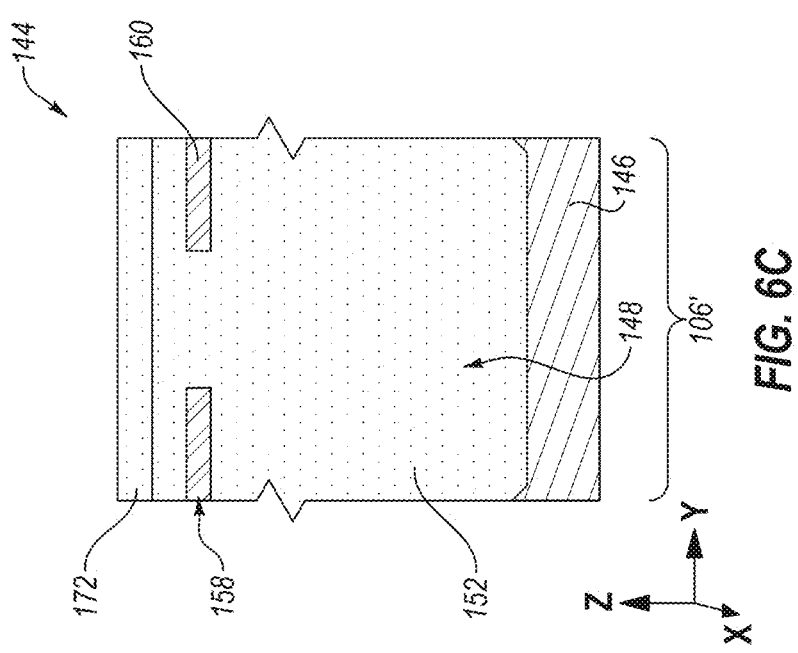
Figure 7B:
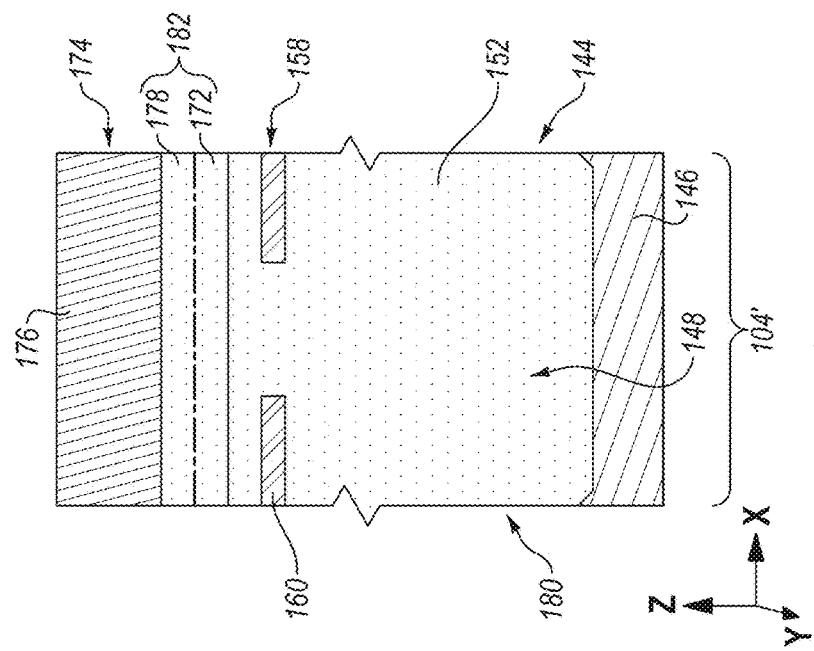
Figure 7A:
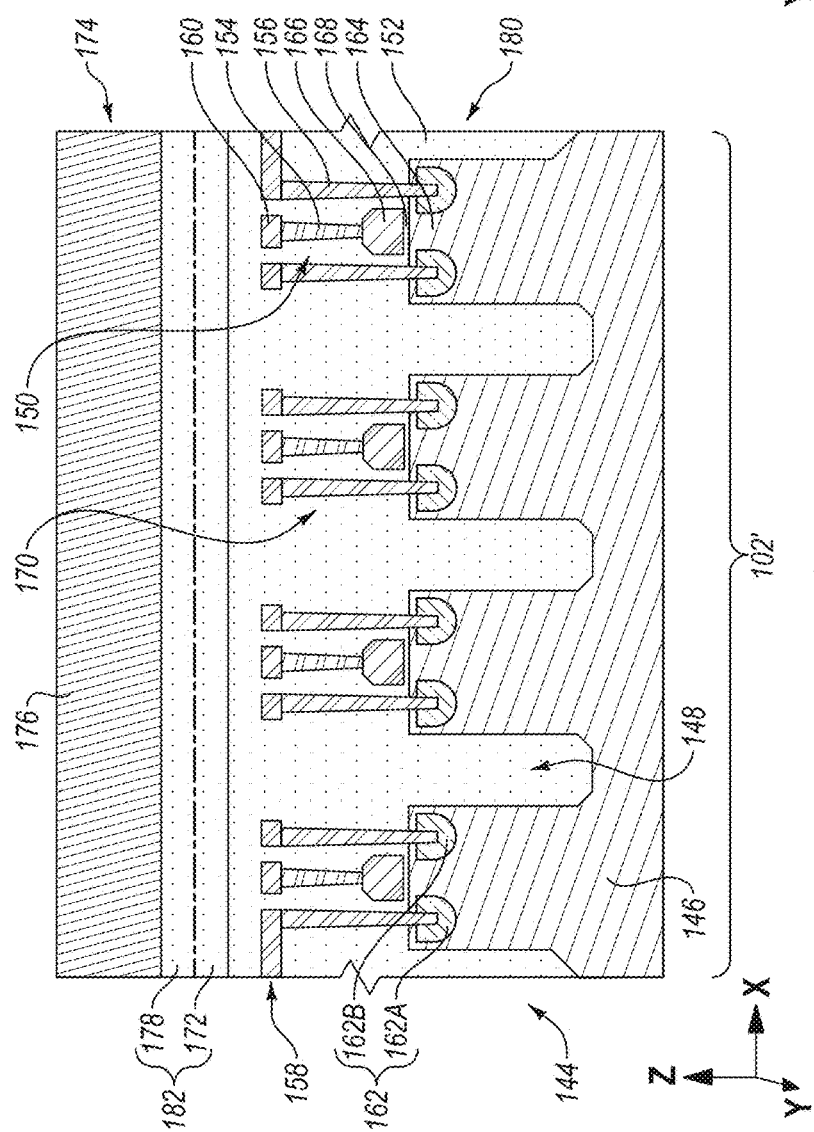
Figure 9D:
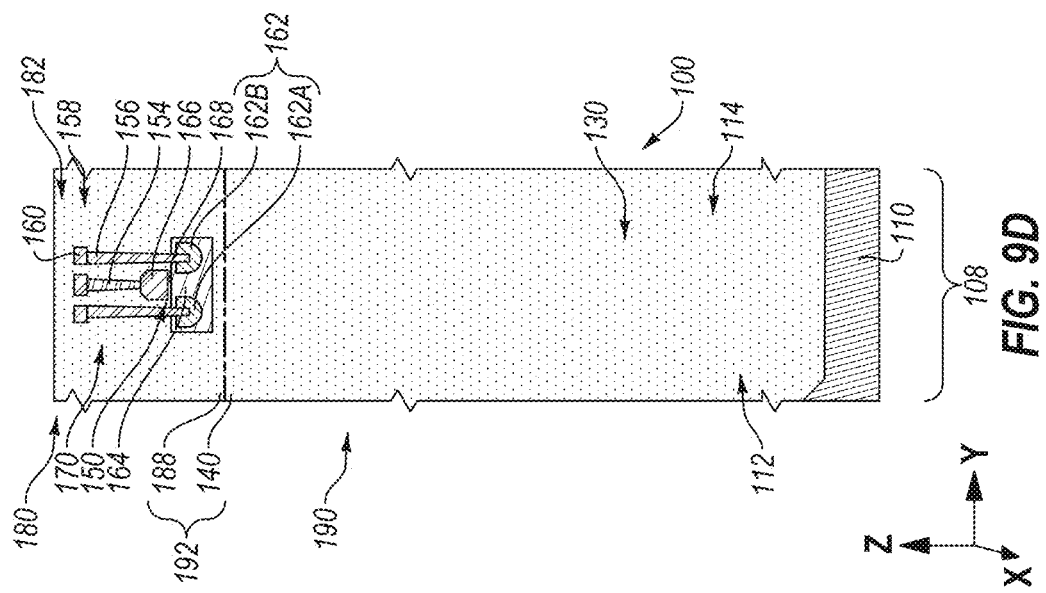
Figure 9C:
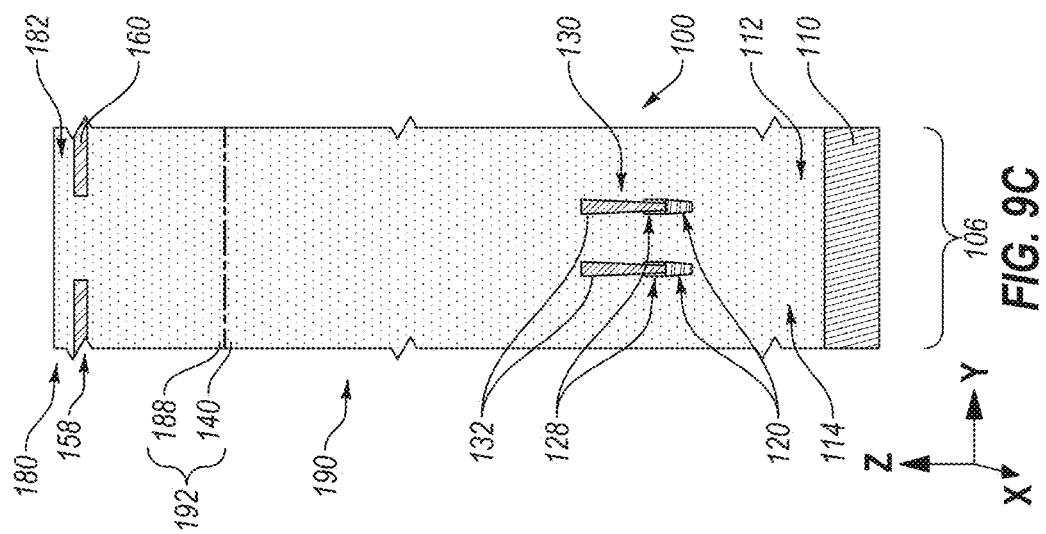

Referring next to FIGS. 6A through 6D, illustrated are simplified, partial longitudinal cross-sectional views of different regions of a second microelectronic device structure 144 (e.g., a second wafer) formed separate from the first microelectronic device structure 100 (FIGS. 5A through 5D). The second microelectronic device structure 144 may be formed to have an arrangement of different regions (e.g., array regions, digit line exit regions, word line exit regions, socket regions) corresponding to (e.g., substantially the same as) the arrangement of different regions (e.g., the array regions 102, the digit line exit regions 104, the word line exit regions 106, the socket regions 108) previously described with reference to FIGS. 1 through 5D. FIG. 6A illustrates a simplified, partial longitudinal cross-sectional view from the perspective of the Y-direction (so as to depict an XZ-plane) of an array region 102' of the second microelectronic device structure 144. FIG. 6B illustrates a simplified, partial longitudinal cross-sectional view from the perspective of the Y-direction (so as to depict an XZ-plane) of a digit line exit region 104' of the second microelectronic device structure 144. FIG. 6C illustrates a simplified, partial longitudinal cross-sectional view from the perspective of the X-direction (so as to depict an YZ-plane) of a word line exit region 106' of the second microelectronic device structure 144. FIG. 6D illustrates a simplified, partial longitudinal cross-sectional view from the perspective of the X-direction (so as to depict an YZ-plane) of a socket region 108' of the second microelectronic device structure 144.

As shown in FIGS. 6A through 6D, the second microelectronic device structure 144 may be formed to include a second base semiconductor structure 146, additional filled trenches 148, transistors 150 (FIGS. 6A and 6D), a fourth isolation material 152, fourth contact structures 154 (FIGS. 6A and 6D), fifth contact structures 156 (FIGS. 6A and 6D), and at least one second routing tier 158 (FIGS. 6A and 6D) including second routing structures 160 (FIGS. 6A and 6D). The additional filled trenches 148 vertically extend (e.g., in the Z-direction) into the second base semiconductor structure 146. The transistors 150 at least partially vertically overlie the second base semiconductor structure 146 and the additional filled trenches 148. The fourth contact structures 154 and fifth contact structures 156 contact the transistors 150. Some of the second routing structures 160 contact some of the fourth contact structures 154, and some other of the second routing structures 160 contact some of the fifth contact structures 156. The fourth isolation material 152 may substantially cover and surround the second base semiconductor structure 146, the transistors 150, the fourth contact structures 154, the fifth contact structures 156, and the second routing structures 160.

The second base semiconductor structure 146 comprises a base material or construction upon which additional features (e.g., materials, structures, devices) of the second microelectronic device structure 144 are formed. The second base semiconductor structure 146 may comprise a semiconductor structure (e.g., a semiconductor wafer), or a base semiconductor material on a supporting structure. For example, the second base semiconductor structure 146 may comprise a conventional silicon substrate (e.g., a conventional silicon wafer), or another bulk substrate comprising a semiconductor material. In some embodiments, the second base semiconductor structure 146 comprises a silicon wafer. The second base semiconductor structure 146 may include one or more layers, structures, and/or regions formed therein and/or thereon.

The additional filled trenches 148 may comprise trenches (e.g., openings, vias, apertures) within the second base semiconductor structure 146 that are at least partially (e.g., substantially) filled with the fourth isolation material 152. The additional filled trenches 148 may, for example, be employed as STI structures within the second base semiconductor structure 146. The additional filled trenches 148 may be formed to vertically extend partially (e.g., less than completely) through the second base semiconductor structure 146. Each of the additional filled trenches 148 may be formed to exhibit substantially the same dimensions and shape as each other of the additional filled trenches 148, or at least one of the additional filled trenches 148 may be formed to exhibit one or more of different dimensions and a different shape than at least one other of the additional filled trenches 148. As a non-limiting example, each of the additional filled trenches 148 may be formed to exhibit substantially the same vertical dimension(s) and substantially the same vertical cross-sectional shape(s) as each other of the additional filled trenches 148; or at least one of the additional filled trenches 148 may be formed to exhibit one or more of different vertical dimension(s) and different vertical cross-sectional shape(s) than at least one other of the additional filled trenches 148. In some embodiments, the additional filled trenches 148 are all formed to vertically extend to and terminate at substantially the same depth within the second base semiconductor structure 146. In additional embodiments, at least one of the additional filled trenches 148 is formed to vertically extend to and terminate at a relatively deeper depth within the second base semiconductor structure 146 than at least one other of the additional filled trenches 148. As another non-limiting example, each of the additional filled trenches 148 may be formed to exhibit substantially the same horizontal dimension(s) and substantially the same horizontal cross-sectional shape(s) as each other of the additional filled trenches 148; or at least one of the additional filled trenches 148 may be formed to exhibit one or more of different horizontal dimension(s) (e.g., relatively larger horizontal dimension(s), relatively smaller horizontal dimension(s)) and different horizontal cross-sectional shape(s) than at least one other of the additional filled trenches 148. In some embodiments, at least one of the additional filled trenches 148 is formed to have one or more different horizontal dimensions (e.g., in the X-direction and/or in the Y-direction) than at least one other of the additional filled trenches 148.

Referring collectively to FIGS. 6A and 6D, the transistors 150 may individually be formed to include conductively doped regions 162, a channel region 164, a gate structure 166, and a gate dielectric material 168. For an transistor 150, the conductively doped regions 162 may be formed within the second base semiconductor structure 146 (e.g., formed within portions (e.g., relatively elevated portions) of the second base semiconductor structure 146 horizontally neighboring the additional filled trenches 148 horizontally neighboring at least one of the additional filled trenches 148); the channel region 164 may be within the second base semiconductor structure 146 and may be horizontally interposed between the conductively doped regions 162 thereof; the gate structure 166 may vertically overlie the channel region 164; and the gate dielectric material 168 (e.g., a dielectric oxide) may be vertically interposed (e.g., in the Z-direction) between the gate structure 166 and the channel region 164. The conductively doped regions 162 of an individual transistor 150 may include a source region 162A and a drain region 162B.

Referring collectively to FIGS. 6A and 6D, for an individual transistor 150, the conductively doped regions 162 thereof may comprise semiconductor material of the second base semiconductor structure 146 doped with one or more desired conductivity-enhancing dopants. In some embodiments, the conductively doped regions 162 of the transistor 150 comprise semiconductor material (e.g., silicon) doped with at least one N-type dopant (e.g., one or more of phosphorus, arsenic, antimony, and bismuth). In some of such embodiments, the channel region 164 of the transistor 150 comprises the semiconductor material doped with at least one P-type dopant (e.g., one or more of boron, aluminum, and gallium). In some other of such embodiments, the channel region 164 of the transistor 150 comprises substantially undoped semiconductor material (e.g., substantially undoped silicon). In additional embodiments, for an individual transistor 150, the conductively doped regions 162 thereof comprise semiconductor material (e.g., silicon) doped with at least one P-type dopant (e.g., one or more of boron, aluminum, and gallium). In some of such additional embodiments, the channel region 164 of the transistor 150 comprises the semiconductor material doped with at least one N-type dopant (e.g., one or more of phosphorus, arsenic, antimony, and bismuth). In some other of such additional embodiments, the channel region 164 of the transistor 150 comprised substantially undoped semiconductor material (e.g., substantially undoped silicon).

Still referring collectively to FIGS. 6A and 6D, the gate structures 166 (e.g., gate electrodes) may individually horizontally extend (e.g., in the X-direction) between and be employed by multiple transistors 150. The gate structures 166 may be formed of and include conductive material. The gate structures 166 may individually be substantially homogeneous, or the gate structures 166 may individually be heterogeneous. In some embodiments, the gate structures 166 are each substantially homogeneous. In additional embodiments, the gate structures 166 are each heterogeneous. Individual gate structures 166 may, for example, be formed of and include a stack of at least two different conductive materials.

Still referring to FIGS. 6A and 6D, the fourth contact structures 154 may individually be formed to vertically extend between and couple the gate structures 166 (and, hence, the transistors 150) to one or more of the second routing structures 160 of the second routing tier 158. The fourth contact structures 154 may individually be formed of and include conductive material. By way of non-limiting example, the fourth contact structures 154 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fourth contact structures 154 are formed of and include W. In additional embodiments, the fourth contact structures 154 are formed of and include Cu.

As also shown in FIGS. 6A and 6D, the fifth contact structures 156 may be formed to vertically extend between and couple the conductively doped regions 162 (e.g., the source region 162A, the drain region 162B) of the transistors 150 to some of the second routing structures 160 of the second routing tier 158. The fifth contact structures 156 may individually be formed of and include conductive material. By way of non-limiting example, the fifth contact structures 156 may be formed of and include one or more of at least one metal, at least one alloy, and at least one conductive metal-containing material (e.g., a conductive metal nitride, a conductive metal silicide, a conductive metal carbide, a conductive metal oxide). A material composition of the fifth contact structures 156 may be substantially the same as a material composition of the fourth contact structures 154, or the material composition of one or more of the fifth contact structures 156 may be different than the material composition of one or more of the fourth contact structures 154. In some embodiments, the fifth contact structures 156 are formed of and include W. In additional embodiments, the fifth contact structures 156 are formed of and include Cu.

Referring collectively to FIGS. 6A through 6D, the second routing structures 160 of the second routing tier 158 may be formed of and include conductive material. By way of non-limiting example, the second routing structures 160 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the second routing structures 160 are formed of and include W. In additional embodiments, the second routing structures 160 are formed of and include Cu. At least some of the second routing structures 160 may be employed as local routing structures of a microelectronic device (e.g., a memory device, such as a DRAM device).

While FIGS. 6A through 6D show the formation of a single (e.g., only one) second routing tier 158 including second routing structures 160, multiple (e.g., more than one) second routing tiers 158 each individually including a desired arrangement (e.g., pattern) of second routing structures 160 may be formed. By of non-limiting example, two or more (e.g., three or more) of the second routing tiers 158 may be formed, wherein different second routing tiers 158 are vertically offset from one another and each individually include a desired arrangement of second routing structures 160 therein. At least some of the second routing structures 160 within at least one of the second routing tiers 158 may be coupled to at least some of the second routing structures 160 within at least one other of the second routing tiers 158 by way of conductive interconnect structures.

With continued collective reference to FIGS. 6A though 6D, the transistors 150, the second routing structures 160, the fourth contact structures 154, the fifth contact structures 156 may form control logic circuitry of various control logic devices 170 (FIGS. 6A and 6D) configured to control various operations of various features (e.g., the memory cells 142 (FIG. 6A)) of a microelectronic device (e.g., a memory device, such as a DRAM device) to be formed through the methods of disclosure. In some embodiments, the control logic devices 170 comprise CMOS circuitry. As a non-limiting example, the control logic devices 170 may include one or more (e.g., each) of charge pumps (e.g., VCCP charge pumps, $V_{NEGWL}$ charge pumps, DVC2 charge pumps), delay-locked loop (DLL) circuitry (e.g., ring oscillators), $V_{dd}$ regulators, drivers (e.g., main word line drivers, sub word line drivers (SWD)), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, array multiplexers (MUX), error checking and correction (ECC) devices, self-refresh/wear leveling devices, and other chip/deck control circuitry. Different regions (e.g., the array region 102' (FIG. 6A), the socket region 108' (FIG. 6D)) may have different control logic devices 170 formed within horizontal boundaries thereof.

Still referring to FIGS. 6A through 6D, the fourth isolation material 152 covering and surrounding the second base semiconductor structure 146, the transistors 150 (FIGS. 6A and 6D), the gate structures 166 (FIGS. 6A and 6D), the fourth contact structures 154 (FIGS. 6A and 6D), the fifth contact structures 156 (FIGS. 6A and 6D), and the second routing structures 160 (FIGS. 6A and 6D) may be formed of and include at least one insulative material. A material composition of the fourth isolation material 152 may be substantially the same as a material composition of the third isolation material 140 (FIGS. 5A through 5D) of the first microelectronic device structure 100 (FIGS. 5A through 5D), or the material composition of the fourth isolation material 152 may be different than the material composition of the third isolation material 140 (FIGS. 5A through 5D). In some embodiments, the fourth isolation material 152 is formed of and includes a dielectric oxide material, such as $SiO_x$ (e.g., $SiO_2$). The fourth isolation material 152 may be substantially homogeneous, or the fourth isolation material 152 may be heterogeneous. In some embodiments, the fourth isolation material 152 is substantially homogeneous. In additional embodiments, the fourth isolation material 152 is heterogeneous. The fourth isolation material 152 may, for example, be formed of and include a stack of at least two different dielectric materials. An upper surface of the fourth isolation material 152 may be formed to vertically overlie upper boundaries (e.g., upper surfaces) of the second routing structures 160 (FIGS. 6A through 6D).

As collectively shown in FIGS. 6A through 6D, at least one first sacrificial material 172 may be formed on or over the fourth isolation material 152. In some embodiments, the first sacrificial material 172 is formed on an upper surface of the fourth isolation material 152. The first sacrificial material 172 may be formulated and configured to bond to additional material of an additional microelectronic device structure (e.g., a third microelectronic device structure) to be attached to the second microelectronic device structure 144, as described in further detail below. The first sacrificial material 172 may, for example, be employed to protect or otherwise mitigate damage to features (e.g., materials, structures, devices) of the second microelectronic device structure 144 during subsequent processing acts, as also described in further detail below. In some embodiments, the first sacrificial material 172 is formed of and includes at least one insulative material. A material composition of the first sacrificial material 172 may be substantially the same as a material composition of the fourth isolation material 152, or the material composition of the first sacrificial material 172 may be different than the material composition of the fourth isolation material 152. In some embodiments, the first sacrificial material 172 is formed of and includes a dielectric oxide material, such as $SiO_x$ (e.g., $SiO_2$). The first sacrificial material 172 may be substantially homogeneous, or the first sacrificial material 172 may be heterogeneous. In some embodiments, the first sacrificial material 172 is substantially homogeneous. In additional embodiments, the first sacrificial material 172 is heterogeneous. The first sacrificial material 172 may, for example, be formed of and include a stack of at least two different dielectric materials. An upper surface of the first sacrificial material 172 may be formed to be substantially planar and to vertically overlie an upper boundary (e.g., an upper surface) of the fourth isolation material 152. In additional embodiments, the first sacrificial material 172 is not formed on or over the fourth isolation material 152.

Referring next to FIGS. 7A through 7D, illustrated are simplified, partial longitudinal cross-sectional views, from the directional perspectives previously described, of the array region 102' (FIG. 7A), the digit line exit region 104' (FIG. 7B), the word line exit region 106' (FIG. 7C), and the socket region 108' (FIG. 7D) at a processing stage of the method of forming the microelectronic device following the processing stage previously described with reference to FIGS. 6A through 6D. As collectively depicted in FIGS. 7A through 7D, a third microelectronic device structure 174 (e.g., a third wafer) including an additional base structure 176 and a second sacrificial material 178 may be attached to the first sacrificial material 172 (or the fourth isolation material 152, if formation of the first sacrificial material 172 is omitted) of the second microelectronic device structure 144 to form a first microelectronic device structure assembly 180.

The additional base structure 176 of the third microelectronic device structure 174 comprises a base material or construction upon which additional features (e.g., materials, structures, devices) are formed. In some embodiments, the additional base structure 176 comprises a wafer. The additional base structure 176 may be formed of and include one or more of semiconductor material (e.g., one or more of a silicon material, such as monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductor material on a supporting structure, glass material (e.g., one or more of BSP, PSG, FSG, BPSG, aluminosilicate glass, an alkaline earth boro-aluminosilicate glass, quartz, titania silicate glass, and soda-lime glass), and ceramic material (e.g., one or more of p-AlN, SOPAN, AlN, aluminum oxide (e.g., sapphire; $\alpha\text{-}Al_2O_3$), and silicon carbide). By way of non-limiting example, the additional base structure 176 may comprise a semiconductor wafer (e.g., a silicon wafer), a glass wafer, or a ceramic wafer. The additional base structure 176 may include one or more layers, structures, and/or regions formed therein and/or thereon.

The second sacrificial material 178 of the third microelectronic device structure 174 may be formed on or over the additional base structure 176. The second sacrificial material 178 may be formulated and configured to bond to the first sacrificial material 172 (or the fourth isolation material 152, if formation of the first sacrificial material 172 is omitted) of the second microelectronic device structure 144. In some embodiments, the second sacrificial material 178 is formed of and includes at least one insulative material. A material composition of the second sacrificial material 178 may be substantially the same as a material composition of the first sacrificial material 172 (and/or the fourth isolation material 152) of the second microelectronic device structure 144; or the material composition of the second sacrificial material 178 may be different than the material composition of the first sacrificial material 172 (and/or the fourth isolation material 152). In some embodiments, the second sacrificial material 178 is formed of and includes a dielectric oxide material, such as $SiO_x$ (e.g., $SiO_2$). The second sacrificial material 178 may be substantially homogeneous, or the second sacrificial material 178 may be heterogeneous. In some embodiments, the second sacrificial material 178 is substantially homogeneous. In additional embodiments, the second sacrificial material 178 is heterogeneous. The second sacrificial material 178 may, for example, be formed of and include a stack of at least two different dielectric materials.

To attach the third microelectronic device structure 174 to the second microelectronic device structure 144, the third microelectronic device structure 174 may be vertically inverted (e.g., flipped upside down in the Z-direction), the second sacrificial material 178 thereof may be provided in physical contact with the first sacrificial material 172 (or the fourth isolation material 152, if formation of the first sacrificial material 172 is omitted), and the second sacrificial material 178 and the first sacrificial material 172 (and/or the fourth isolation material 152) may be exposed to annealing conditions to form bonds (e.g., oxide-to-oxide bonds) between the second sacrificial material 178 and the first sacrificial material 172 (or the fourth isolation material 152). By way of non-limiting example, the second sacrificial material 178 and the first sacrificial material 172 (and/or the fourth isolation material 152) may be exposed to a temperature greater than or equal to about 400° C. (e.g., within a range of from about 400° C. to about 800° C., greater than about 800° C.) to form oxide-to-oxide bonds between the fourth isolation material 152 and the first sacrificial material 172 (or the fourth isolation material 152). In some embodiments, the first sacrificial material 172 and the second sacrificial material 178 are exposed to at least one temperature greater than about 800° C. to form oxide-to-oxide bonds between the first sacrificial material 172 and the second sacrificial material 178.

As shown in FIGS. 7A through 7D, bonding the second sacrificial material 178 to the first sacrificial material 172 (or the fourth isolation material 152, if formation of the first sacrificial material 172 is omitted) may form a connected sacrificial structure 182. In FIGS. 7A through 7D, the second sacrificial material 178 and the first sacrificial material 172 of the connected sacrificial structure 182 are distinguished from one another by way of a dashed line. However, the second sacrificial material 178 to the first sacrificial material 172 (or the fourth isolation material 152) may be integral and continuous with one another. Put another way, the connected sacrificial structure 182 may be a substantially monolithic structure including the second sacrificial material 178 as a first region thereof, and the first sacrificial material 172 (or the fourth isolation material 152) as a second region thereof. For the connected sacrificial structure 182, the second sacrificial material 178 thereof may be attached to the first sacrificial material 172 (or the fourth isolation material 152) thereof without a bond line.

Referring next to FIGS. 8A through 8D, illustrated are simplified, partial longitudinal cross-sectional views, from the directional perspectives previously described, of the array region 102' (FIG. 8A), the digit line exit region 104' (FIG. 8B), the word line exit region 106' (FIG. 8C), and the socket region 108' (FIG. 8D) at a processing stage of the method of forming the microelectronic device following the processing stage previously described with reference to FIGS. 7A through 7D. As collectively depicted in FIGS. 8A through 8D, the first microelectronic device structure assembly 180 may be vertically inverted (e.g., flipped upside down in the Z-direction), and an upper portion of the second base semiconductor structure 146 (FIGS. 7A through 7D) may be removed to expose (e.g., uncover) the fourth isolation material 152 within the additional filled trenches 148 (FIGS. 7A through 7D) and form a second semiconductor tier 184 (FIGS. 8A and 8D) including second semiconductor structures 186 separated from one another by remaining portions of the fourth isolation material 152. Thereafter, a fifth isolation material 188 may be formed on or over surfaces of the second semiconductor structures 186 and the fourth isolation material 152.

The upper portion of the second base semiconductor structure 146 (FIGS. 7A through 7D) vertically overlying the additional filled trenches 148 (FIGS. 7A through 7D) following the vertical inversion of the first microelectronic device structure assembly 180 may be removed using at least one conventional wafer thinning process (e.g., a conventional CMP process; a conventional etching process, such as a conventional dry etching process, or a conventional wet etching process). The second semiconductor structures 186 may be formed to exhibit a desired vertical height (e.g., in the Z-direction) through the material removal process. The material removal process may also remove portions (e.g., upper portions following the vertical inversion of the first microelectronic device structure assembly 180) of the fourth isolation material 152.

Referring collectively to FIGS. 8A through 8D, the fifth isolation material 188 formed to cover the second semiconductor structures 186 (FIGS. 8A and 8D) and the fourth isolation material 152 may be formed of and include at least one insulative material. A material composition of the fifth isolation material 188 may be substantially the same as a material composition of the fourth isolation material 152, or the material composition of the fifth isolation material 188 may be different than the material composition of the fourth isolation material 152. In some embodiments, the fifth isolation material 188 is formed of and includes a dielectric oxide material, such as $SiO_x$ (e.g., $SiO_2$). The fifth isolation material 188 may be substantially homogeneous, or the fifth isolation material 188 may be heterogeneous. In some embodiments, the fifth isolation material 188 is substantially homogeneous. In additional embodiments, the fifth isolation material 188 is heterogeneous. The fifth isolation material 188 may, for example, be formed of and include a stack of at least two different dielectric materials. As shown in FIGS. 8A through 8D, an upper surface of the fifth isolation material 188 may be formed to be substantially planar.

Referring next to FIGS. 9A through 9D, illustrated are simplified, partial longitudinal cross-sectional views, from the directional perspectives previously described, of the array region 102 (FIG. 9A), the digit line exit region 104 (FIG. 9B), the word line exit region 106 (FIG. 9C), and the socket region 108 (FIG. 9D) previously described with reference to FIGS. 2A through 2D at a processing stage of the method of forming the microelectronic device following the processing stages previously described with reference to FIGS. 5A through 5D and FIGS. 8A through 8D. As depicted in FIGS. 9A through 9D, following the processing stage previously described with reference to FIGS. 8A through 8D, the first microelectronic device structure assembly 180 may be vertically inverted (e.g., flipped upside down in the Z-direction) and the fifth isolation material 188 thereof may be attached (e.g., bonded, such as through oxide-oxide bonding) to the third isolation material 140 of the first microelectronic device structure 100 to form a second microelectronic device structure assembly 190. Attaching (e.g., bonding) the fifth isolation material 188 of the first microelectronic device structure assembly 180 to the third isolation material 140 of the first microelectronic device structure assembly 180 may form a second connected isolation structure 192 of the second microelectronic device structure assembly 190. Following the attachment of the fifth isolation material 188 to the third isolation material 140, at least the additional base structure 176 (FIGS. 8A through 8D) of the first microelectronic device structure assembly 180 may be removed.

As depicted in FIGS. 9A through 9D, the first microelectronic device structure assembly 180 may be attached to the first microelectronic device structure 100 such that array regions 102' (FIG. 8A), digit line exit regions 104' (FIG. 8B), word line exit region 106' (FIG. 8C), and socket regions 108' (FIG. 8D) of the first microelectronic device structure assembly 180 horizontally overlap (e.g., are substantially horizontally aligned with) array regions 102 (FIG. 5A), digit line exit regions 104 (FIG. 5B), word line exit regions 106 (FIG. 5C), and socket regions 108 (FIG. 5D) of the first microelectronic device structure 100, respectively. Thus, in FIGS. 9A through 9D, the array region 102 (FIG. 9A), the digit line exit region 104 (FIG. 9B), the word line exit region 106 (FIG. 9C), and the socket region 108 (FIG. 9D) respectively include features of the array region 102' (FIG. 8A), the digit line exit region 104' (FIG. 8B), the word line exit region 106' (FIG. 8C), and the socket region 108' (FIG. 8D) of the first microelectronic device structure assembly 180 following the processing stage previously described with reference to FIGS. 8A through 8D. While the different regions shown in FIGS. 9A through 9D were previously described as different regions of the first microelectronic device structure 100 (FIGS. 1 and 5A through 5D) formed by processing the first microelectronic device structure 100 according to the methods of the disclosure, it will be understood that these regions become regions of a microelectronic device of the disclosure formed using the first microelectronic device structure 100 and the first microelectronic device structure assembly 180, as described in further detail below. Thus, these different regions are not limited to the features (e.g., structures, materials, devices) and/or portions of features of the first microelectronic device structure 100. Instead, these regions evolve through the methods of the disclosure to encompass and include additional features (e.g., additional structures, additional materials, additional devices), portions of additional features, and/or modified features.

To form the second microelectronic device structure assembly 190, the fifth isolation material 188 of the first microelectronic device structure assembly 180 may be provided in physical contact with the third isolation material 140 of the first microelectronic device structure 100, and then the fifth isolation material 188 and the third isolation material 140 may be exposed to annealing conditions to form bonds (e.g., oxide-to-oxide bonds) between the fifth isolation material 188 and the third isolation material 140. By way of non-limiting example, the fifth isolation material 188 and the third isolation material 140 may be exposed to a temperature greater than or equal to about 400° C. (e.g., within a range of from about 400° C. to about 800° C., greater than about 800° C.) to form oxide-to-oxide bonds between the fifth isolation material 188 and the third isolation material 140. In some embodiments, the fifth isolation material 188 and the third isolation material 140 are exposed to at least one temperature greater than about 800° C. to form oxide-to-oxide bonds between the fifth isolation material 188 and the third isolation material 140.

In FIGS. 9A through 9D, the fifth isolation material 188 and the third isolation material 140 of the second connected isolation structure 192 are distinguished from one another by way of a dashed line. However, the fifth isolation material 188 and the third isolation material 140 may be integral and continuous with one another. Put another way, second connected isolation structure 192 may be a substantially monolithic structure including the fifth isolation material 188 as a first region (e.g., an upper region) thereof, and the third isolation material 140 as a second region (e.g., a lower region) thereof. For the second connected isolation structure 192, the fifth isolation material 188 thereof may be attached to the third isolation material 140 thereof without a bond line.

As shown in FIGS. 9A through 9D, following the removal of the additional base structure 176 (FIGS. 8A through 8D), the connected sacrificial structure 182 may be at least partially maintained. In some such embodiments, at least one additional isolation material (e.g., dielectric oxide material, such as $SiO_x$; dielectric nitride material, such as $SiN_y$) may be formed (e.g., deposited, grown) on or over the maintained portion of the connected sacrificial structure 182. In further embodiments, in addition to the additional base structure 176 (FIGS. 8A through 8D), the connected sacrificial structure 182 is also substantially removed (e.g., is not at least partially maintained). In some such further embodiments, at least one additional isolation material (e.g., dielectric oxide material, such as $SiO_x$; dielectric nitride material, such as $SiN_y$) may be formed on or over remaining portions of the fourth isolation material 152 following the substantial removal of the connected sacrificial structure 182.

Referring next to FIGS. 10A through 10D, illustrated are simplified, partial longitudinal cross-sectional views, from the directional perspectives previously described, of the array region 102 (FIG. 10A), the digit line exit region 104 (FIG. 10B), the word line exit region 106 (FIG. 10C), and the socket region 108 (FIG. 10D) at a processing stage of the method of forming the microelectronic device following the processing stage previously described with reference to FIGS. 9A through 9D. As collectively depicted in FIGS. 10B and 10C, sixth contact structures 194 may be formed within the digit line exit region 104 (FIG. 10B) and the word line exit region 106 (FIG. 10C). As described in further detail below, some of the sixth contact structures 194 may be formed to be coupled to digit lines 118 (FIG. 10B) within the digit line exit region 104 (FIG. 10B), and some other of the sixth contact structures 194 may be formed to be coupled to word lines 120 (FIG. 10C) within the word line exit region 106 (FIG. 10C). The formation of the sixth contact structures 194 may reduce contact misalignment risks and/or alleviate the need for relatively complex contact alignment operations and systems as compared to conventional methods of the forming contact structures coupled to conductive line structures (e.g., digit lines, word lines). Registration marks for the formation of the sixth contact structures 194 may be clearly observed through the isolation materials (e.g., dielectric oxide materials, such as $SiO_x$) of the second microelectronic device structure assembly 190.

Referring to FIG. 10B, within the digit line exit region 104, a first group 194A of the sixth contact structures 194 may be formed to contact at least some of the digit lines 118 horizontally extending (e.g., in the Y-direction) into the digit line exit region 104. Each sixth contact structure 194 of the first group 194A of sixth contact structures 194 may be considered to be a digit line contact structure (e.g., a so-called "edge of array" digit line contact structure). As shown in FIG. 10B, each sixth contact structure 194 of the first group 194A of sixth contact structures 194 may be formed to physically contact an individual digit line 118. For example, within the digit line exit region 104, each sixth contact structure 194 of the first group 194A may be formed to vertically extend through each of a remainder of the connected sacrificial structure 182 (if any), the fourth isolation material 152, the second connected isolation structure 192, and the third isolation material 140, and to physically contact one of the digit lines 118. Each sixth contact structure 194 of the first group 194A may individually be formed to vertically terminate on, within, or below one of the digit lines 118. In some embodiments, each sixth contact structure 194 of the first group 194A is individually formed to terminate at an upper surface of one of the digit lines 118, such that the sixth contact structure 194 is located on (e.g., physically contacts) the upper surface of the digit line 118. In additional embodiments, each sixth contact structure 194 of the first group 194A is individually formed to terminate within one of the digit lines 118, such that a lower boundary of the sixth contact structure 194 is positioned within vertical boundaries (e.g., between an upper boundary and a lower boundary) of the digit line 118. In further embodiments, each sixth contact structure 194 of the first group 194A is individually formed to terminate below one of the digit lines 118, such that a lower boundary of the sixth contact structure 194 is positioned below a lower boundary of the digit line 118. Outer sidewalls of each sixth contact structure 194 of the first group 194A may physically contact inner sidewalls of an individual digit line 118.

Referring next to FIG. 10C, within the word line exit region 106, a second group 194B of the sixth contact structures 194 may be formed to be coupled to at least some of the word lines 120 horizontally extending (e.g., in the X-direction) into the word line exit region 106. Each sixth contact structure 194 of the second group 194B of sixth contact structures 194 may be considered to be a word line contact structure (e.g., a so-called "edge of array" word line contact structure). As shown in FIG. 10C, each sixth contact structure 194 of the second group 194B may be formed to physically contact an individual third contact structure 132 contacting an individual word line 120 within the word line exit region 106. For example, within the word line exit region 106, each sixth contact structure 194 of the second group 194B may be formed to vertically extend through each of a remainder of the connected sacrificial structure 182 (if any), the fourth isolation material 152, the second connected isolation structure 192, and the third isolation material 140, and to physically contact one of the third contact structures 132. In some embodiments, each sixth contact structure 194 of the second group 194B is individually formed to terminate at an upper surface of one of the third contact structures 132, such that the sixth contact structure 194 is located on (e.g., physically contacts) the upper surface of the third contact structure 132. In additional embodiments, each sixth contact structure 194 of the second group 194B is individually formed to terminate within one of the third contact structures 132, such that a lower boundary of the sixth contact structure 194 is positioned within vertical boundaries (e.g., between an upper boundary and a lower boundary) of the third contact structure 132.

Referring collectively to FIGS. 10B and 10C, the sixth contact structures 194 (including the first group 194A (FIG. 10B) and the second group 194B (FIG. 10C) thereof) may be formed of and include conductive material. By way of non-limiting example, the sixth contact structures 194 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the sixth contact structures 194 are each individually formed of and include W. Each of the sixth contact structures 194 may be substantially homogeneous, or one or more of the sixth contact structures 194 may individually be heterogeneous. In some embodiments, each of the sixth contact structures 194 is substantially homogeneous. In additional embodiments, each of the sixth contact structures 194 is heterogeneous. Each sixth contact structure 194 may, for example, be formed of and include a stack of at least two different conductive materials.

Referring next to FIGS. 11A through 11D, illustrated are simplified, partial longitudinal cross-sectional views, from the directional perspectives previously described, of the array region 102 (FIG. 11A), the digit line exit region 104 (FIG. 11B), the word line exit region 106 (FIG. 11C), and the socket region 108 (FIG. 11D) at a processing stage of the method of forming the microelectronic device following the processing stage previously described with reference to FIGS. 10A through 10D. As collectively depicted in FIGS. 11A through 11D, BEOL structures may be formed over the second routing tier 158 and the sixth contact structures 194 (FIGS. 11B and 11C). For example, at least one third routing tier 196 (FIGS. 11A and 11D) including third routing structures 198 (FIGS. 11A and 11D) may be formed over the second routing tier 158; at least one fourth routing tier 200 including fourth routing structures 202 may be formed over the third routing tier 196 (FIGS. 11A and 11D); and at least one fifth routing tier 204 including fifth routing structures 206 may be formed over the fourth routing tier 200. One or more of the third routing structures 198 (FIGS. 11A and 11D) of the third routing tier 196 (FIGS. 11A and 11D) may be coupled to one or more of the second routing structures 160 of the second routing tier 158 by way of seventh contact structures 208 (FIGS. 11A and 11D). In addition, one or more of the fourth routing structures 202 of the fourth routing tier 200 may be coupled to one or more of the third routing structures 198 (FIGS. 11A and 11D) of the third routing tier 196 (FIGS. 11A and 11D) by way of eighth contact structures 210 (FIGS. 11A and 11D). Furthermore, one or more of the fifth routing structures 206 (e.g., one or more conductive pad structures) of the fifth routing tier 204 may be coupled to one or more of the fourth routing structures 202 of the fourth routing tier 200 by way of ninth contact structures 212 (FIG. 11D). In additional embodiments, at least some (e.g., all) of the ninth contact structures 212 (FIG. 11D) are omitted (e.g., are not formed), and one or more of the fifth routing structures 206 of the fifth routing tier 204 are formed to directly physically contact one or more of the fourth routing structures 202 of the fourth routing tier 200.

The third routing structures 198 (FIGS. 11A and 11D), the fourth routing structures 202, the fifth routing structures 206, the seventh contact structures 208 (FIGS. 11A and 11D), the eighth contact structures 210 (FIGS. 11A and 11D), and the ninth contact structures 212 (FIG. 11D) (if any) may each be formed of and include conductive material. By way of non-limiting example, the third routing structures 198 (FIGS. 11A and 11D), the fourth routing structures 202, the fifth routing structures 206, the seventh contact structures 208 (FIGS. 11A and 11D), the eighth contact structures 210 (FIGS. 11A and 11D), and the ninth contact structures 212 (FIG. 11D) may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third routing structures 198 (FIGS. 11A and 11D) are each formed of and include W; the fourth routing structures 202 are each formed of and include Cu; the fifth routing structures 206 are formed of and include Al; and the seventh contact structures 208 (FIGS. 11A and 11D), the eighth contact structures 210 (FIGS. 11A and 11D), and the ninth contact structures 212 (FIG. 11D) are each formed of and include W.

Still referring to collectively to FIGS. 11A through 11D, a sixth isolation material 214 may be formed on or over portions of at least the third routing structures 198 (FIGS. 11A and 11D), the fourth routing structures 202, the fifth routing structures 206, the seventh contact structures 208 (FIGS. 11A and 11D), the eighth contact structures 210 (FIGS. 11A and 11D), and the ninth contact structures 212 (FIG. 11D) (if any). The sixth isolation material 214 may be formed of and include at least one insulative material. In some embodiments, the sixth isolation material 214 is formed of and includes a dielectric oxide material, such as $SiO_x$ (e.g., $SiO_2$). The sixth isolation material 214 may be substantially homogeneous, or the sixth isolation material 214 may be heterogeneous. In some embodiments, the sixth isolation material 214 is substantially homogeneous. In additional embodiments, the sixth isolation material 214 is heterogeneous. The sixth isolation material 214 may, for example, be formed of and include a stack of at least two different dielectric materials. In addition, one or more openings may be formed within the sixth isolation material 214 to expose (and, hence, facilitate access to) one or more portions of one or more of the fifth routing structures 206 (e.g., one or more conductive pad structures) of the fifth routing tier 204.

As shown in FIGS. 11A through 11D, the method described above with reference to FIGS. 1 and 2A through 11D may effectuate the formation of a microelectronic device 216 (e.g., a memory device, such as a DRAM device) including the features (e.g., structures, materials, devices) previously described herein. In some embodiments, at least some of the third routing structures 198 (FIGS. 11A and 11D), the fourth routing structures 202, and the fifth routing structures 206 are employed as global routing structures for the microelectronic device 216. The third routing structures 198 (FIGS. 11A and 11D), the fourth routing structures 202, and the fifth routing structures 206 may, for example, be configured to receive global signals from an external bus, and to relay the global signals to other features (e.g., structures, devices) of the microelectronic device 216.

Thus, in accordance with embodiments of the disclosure, a method of forming a microelectronic device comprises forming a microelectronic device structure comprising memory cells, digit lines, word lines, and at least one isolation material covering and surrounding the memory cells, the digit lines, and the word lines. An additional microelectronic device structure comprising control logic devices and at least one additional isolation material covering and surrounding the control logic devices is formed. The additional microelectronic device structure is attached to the microelectronic device structure to form an assembly. The control logic devices overlie the memory cells within the assembly. Contact structures are formed to extend through the at least one isolation material and the at least one additional isolation material after forming the assembly. Some of the contact structures are coupled to some of the digit lines and some of the control logic devices. Some other of the contact structures are coupled to some of the word lines and some other of the control logic devices.

Figure 12:
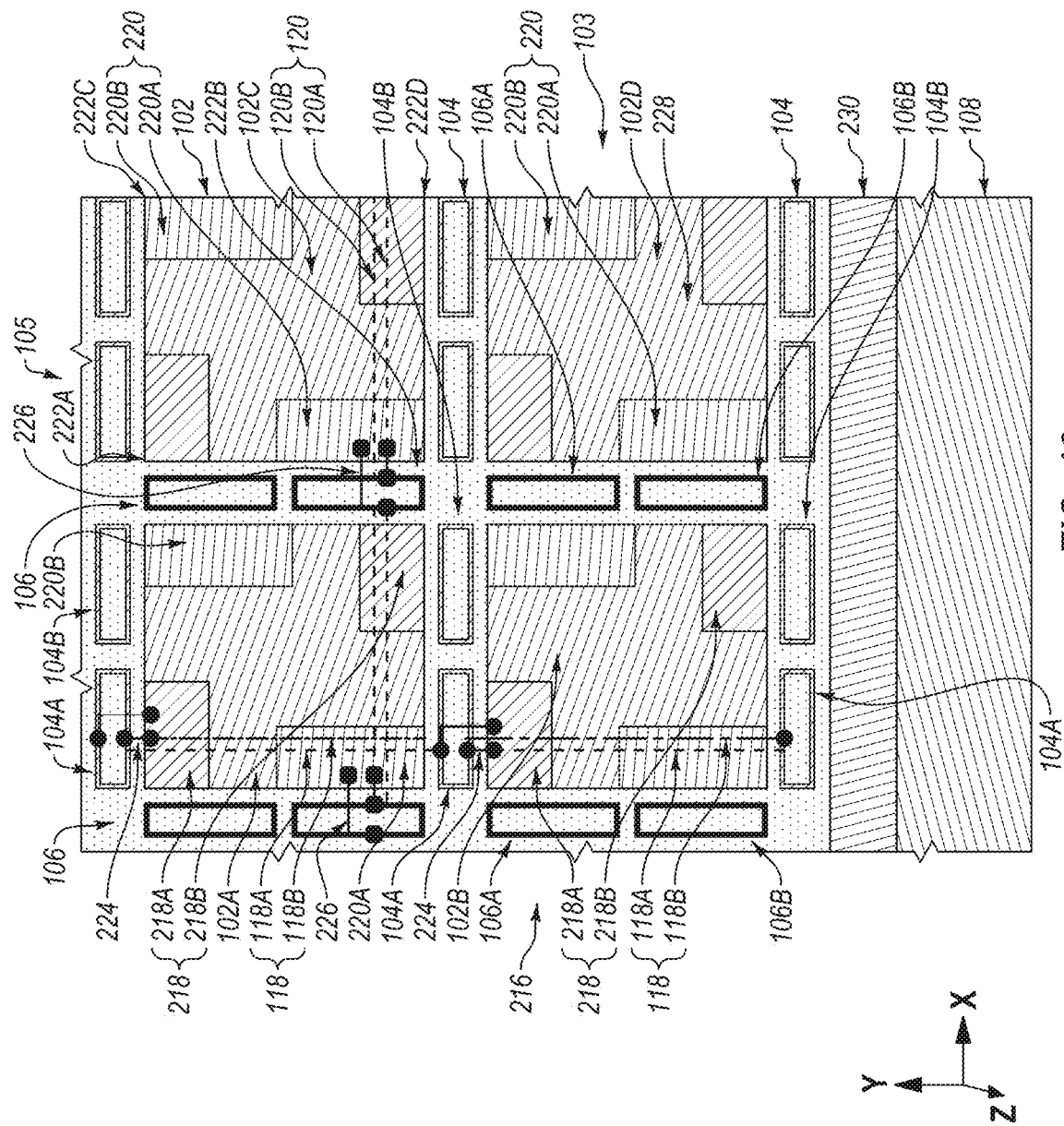
FIG. 12 is a simplified plan view of a microelectronic device, in accordance with an embodiment of the disclosure.

Referring next to FIG. 12, depicted is a simplified plan view of the microelectronic device 216 illustrating an arrangement of different control logic sections (described in further detail below) within individual different regions (e.g., the array regions 102, such as the first array region 102A, the second array region 102B, the third array region 102C, and the fourth array region 102D; the socket regions 108) of the microelectronic device 216, as well as routing arrangements to different control logic devices (e.g., corresponding to the control logic devices 170 (FIGS. 11A and 11D)) within the different control logic sections, in accordance with embodiments of the disclosure. The different control logic devices of the different control logic sections may be positioned vertically above (e.g., in the Z-direction) the memory cells 142 (FIG. 11A) of the microelectronic device 216. At least some of the different control logic devices may be coupled to the memory cells 142 (FIG. 11A) in the manner previously described with reference to FIGS. 11A through 11D. For clarity and ease of understanding the description, not all features (e.g., structures, materials, devices) of the microelectronic device 216 previously described with reference to FIGS. 11A through 11D are illustrated in FIG. 12.

As shown in FIG. 12, within a horizontal area of each array region 102, the microelectronic device 216 may be formed to include a desired arrangement of sense amplifier (SA) sections 218 and sub-word line driver (SWD) sections 220. The SA sections 218 may include SA devices coupled to the digit lines 118 of the microelectronic device 216, as described in further detail below. The digit lines 118 may vertically underlie (e.g., in the Z-direction) the SA devices of the SA sections 218 within the microelectronic device 216. The SWD sections 220 may include SWD devices coupled to the word lines 120 of the microelectronic device 216, as also described in further detail below. The word lines 120 may vertically underlie (e.g., in the Z-direction) the SWD devices of the SWD sections 220 within the microelectronic device 216.

The SA sections 218 within a horizontal area of an individual array region 102 (e.g., the first array region 102A, the second array region 102B, the third array region 102C, or the fourth array region 102D) may include a first SA section 218A and a second SA section 218B. For an individual array region 102, the first SA section 218A and the second SA section 218B may be positioned at or proximate opposite corners (e.g., diagonally opposite corners) of the array region 102 than one another. For example, as shown in FIG. 12, for an individual array region 102, the first SA section 218A may be positioned at or proximate a first corner 222A of the array region 102, and the second SA section 218B may be positioned at or proximate a second corner 222B of the array region 102 located diagonally opposite (e.g., kitty-corner) the first corner 222A.

For each SA section 218 (e.g., the first SA section 218A, the second SA section 218B) within an individual array region 102, the SA devices of the SA section 218 may be coupled to a group of the digit lines 118 horizontally extending (e.g., in the Y-direction) through the array region 102 by way of digit line routing and contact structures 224. The digit line routing and contact structures 224 may, for example, correspond to some of the routing structures (e.g., some of the second routing structures 160 (FIGS. 11A and 11B)) and some of the contact structures (e.g., some of the first group 194A (FIG. 11B) of the sixth contact structures 194 (FIG. 11B)) previously described herein.

The SA devices of the SA sections 218 of array regions 102 horizontally neighboring one another in the Y-direction (e.g., the first array region 102A and the second array region 102B; the third array region 102C and the fourth array region 102D) may be coupled to different groups of digit lines 118 than one another. For example, each of the SA sections 218 (e.g., each of the first SA section 218A and the second SA section 218B) of the first array region 102A may include so-called "even" SA devices coupled to even digit lines 118B of the microelectronic device 216 by way of the digit line routing and contact structures 224 associated with the SA sections 218; and each of the SA sections 218 (e.g., each of the first SA section 218A and the second SA section 218B) of the second array region 102B may include so-called "odd" SA devices coupled to odd digit lines 118A of the microelectronic device 216 by way of the digit line routing and contact structures 224 associated with the SA sections 218; or vice versa. The even digit lines 118B of the microelectronic device 216 may horizontally alternate with the odd digit lines 118A of the microelectronic device 216 in the X-direction. The SA devices of each of the SA sections 218 of the first array region 102A may not be coupled to any odd digit lines 118A; and the SA devices of each of the SA sections 218 of the second array region 102B may not be coupled to any even digit lines 118B; or vice versa. Similarly, each of the SA sections 218 (e.g., each of the first SA section 218A and the second SA section 218B) of the third array region 102C horizontally neighboring the first array region 102A in the X-direction may include additional even SA devices coupled to additional even digit lines 118B of the microelectronic device 216 by way of the digit line routing and contact structures 224 associated with the SA sections 218; and each of the SA sections 218 (e.g., each of the first SA section 218A and the second SA section 218B) of the fourth array region 102D horizontally neighboring the second array region 102B in the X-direction may include additional odd SA devices coupled to additional odd digit lines 118A of the microelectronic device 216 by way of the digit line routing and contact structures 224 associated with the SA sections 218; or vice versa.

As shown in FIG. 12, the SA devices (e.g., odd SA devices or even SA devices) within an individual SA section 218 of an individual array region 102 may be coupled to digit lines (e.g., odd digit lines 118A or even digit lines 118B) horizontally extending through the array region 102, and may also be coupled to additional digit lines (e.g., additional odd digit lines 118A or additional even digit lines 118B) horizontally extending through another array region 102 horizontally neighboring the array region 102 in the Y-direction. For example, some odd SA devices within the first SA section 218A of the second array region 102B may be coupled to odd digit lines 118A horizontally extending through the second array region 102B by way of some digit line routing and contact structures 224 extending to and through the first digit line exit subregion 104A horizontally neighboring the second array region 102B in the Y-direction; and some additional odd SA devices within the first SA section 218A of the second array region 102B may be coupled to additional odd digit lines 118A horizontally extending through the first array region 102A by way of some additional digit line routing and contact structures 224 extending to and through the first digit line exit subregion 104A. As another example, some even SA devices within the second SA section 218B of the first array region 102A may be coupled to even digit lines 118B horizontally extending through the first array region 102A by way of some digit line routing and contact structures 224 extending to and through the second digit line exit subregion 104B horizontally neighboring the first array region 102A in the Y-direction; and some additional even SA devices within the second SA section 218B of the first array region 102A may be coupled to additional even digit lines 118B horizontally extending through the second array region 102B by way of some additional digit line routing and contact structures 224 extending to and through the second digit line exit subregion 104B.

With maintained reference to FIG. 12, the SWD sections 220 within a horizontal area of an individual array region 102 (e.g., the first array region 102A, the second array region 102B, the third array region 102C, or the fourth array region 102D) may include a first SWD section 220A and a second SWD section 220B. For an individual array region 102, the first SWD section 220A and the second SWD section 220B may be positioned at or proximate different corners than the first SA section 218A and a second SA section 218B. In addition, the corner of the array region 102 associated with first SWD section 220A may oppose (e.g., diagonally oppose) the corner of the array region 102 associated with second SWD section 220B. For example, as shown in FIG. 12, for an individual array region 102, the first SWD section 220A may be positioned at or proximate a third corner 222C of the array region 102, and the second SWD section 220B may be positioned at or proximate a fourth corner 222D of the array region 102 located diagonally opposite (e.g., kitty-corner) the third corner 222C.

For each SWD section 220 (e.g., the first SWD section 220A, the second SWD section 220B) within an individual array region 102, the SWD devices of the SWD section 220 may be coupled to a group of the word lines 120 horizontally extending (e.g., in the X-direction) through the array region 102 by way of word line routing and contact structures 226. The word line routing and contact structures 226 may, for example, correspond to some of the routing structures (e.g., some of the second routing structures 160 (FIGS. 11A and 11C)) and some of the contact structures (e.g., some of the third contact structures 132 (FIG. 11C); some of the second group 194B (FIG. 11C) of the sixth contact structures 194 (FIG. 11C)) previously described herein.

The SWD devices of the SWD sections 220 of array regions 102 horizontally neighboring one another in the X-direction (e.g., the first array region 102A and the third array region 102C; the second array region 102B and the fourth array region 102D) may be coupled to different groups of word lines 120 than one another. For example, each of the SWD sections 220 (e.g., each of the first SWD section 220A and the second SWD section 220B) of the first array region 102A may include so-called "even" SWD devices coupled to even word lines 120B of the microelectronic device 216 by way of the word line routing and contact structures 226 associated with the SWD sections 220; and each of the SWD sections 220 (e.g., each of the first SWD section 220A and the second SWD section 220B) of the third array region 102C may include so-called "odd" SWD devices coupled to odd word lines 120A of the microelectronic device 216 by way of the word line routing and contact structures 226 associated with the SWD sections 220; or vice versa. The even word lines 120B of the microelectronic device 216 may horizontally alternate with the odd word lines 120A of the microelectronic device 216 in the Y-direction. The SWD devices of each of the SWD sections 220 of the first array region 102A may not be coupled to any odd word lines 120A; and the SWD devices of each of the SWD sections 220 of the third array region 102C may not be coupled to any even word lines 120B; or vice versa. Similarly, each of the SWD sections 220 (e.g., each of the first SWD section 220A and the second SWD section 220B) of the second array region 102B horizontally neighboring the first array region 102A in the Y-direction may include additional even SWD devices coupled to additional even word lines 120B of the microelectronic device 216 by way of the word line routing and contact structures 226 associated with the SWD sections 220; and each of the SWD sections 220 (e.g., each of the first SWD section 220A and the second SWD section 220B) of the fourth array region 102D horizontally neighboring the third array region 102C in the Y-direction may include additional odd SWD devices coupled to additional odd word lines 120A of the microelectronic device 216 by way of the word line routing and contact structures 226 associated with the SWD sections 220; or vice versa.

As shown in FIG. 12, the SWD devices (e.g., odd SWD devices or even SWD devices) within an individual SWD section 220 of an individual array region 102 may be coupled to word lines (e.g., odd word lines 120A or even word lines 120B) horizontally extending through the array region 102, and may also be coupled to additional word lines (e.g., additional odd word lines 120A or additional even word lines 120B) horizontally extending through another array region 102 horizontally neighboring the array region 102 in the X-direction. For example, some odd SWD devices within the first SWD section 220A of the third array region 102C may be coupled to odd word lines 120A horizontally extending through the third array region 102C by way of some word line routing and contact structures 226 extending to and through the second word line exit subregion 106B horizontally neighboring the third array region 102C in the X-direction; and some additional odd SWD devices within the first SWD section 220A of the third array region 102C may be coupled to additional odd word lines 120A horizontally extending through the first array region 102A by way of some additional word line routing and contact structures 226 extending to and through the second word line exit subregion 106B. As another example, some even SWD devices within the second SWD section 220B of the first array region 102A may be coupled to even word lines 120B horizontally extending through the first array region 102A by way of some word line routing and contact structures 226 extending to and through the first word line exit subregion 106A horizontally neighboring the first array region 102A in the X-direction; and some additional even SWD devices within the second SWD section 220B of the first array region 102A may be coupled to additional even word lines 120B horizontally extending through the third array region 102C by way of some additional word line routing and contact structures 226 extending to and through the first word line exit subregion 106A.

With maintained reference to FIG. 12, within a horizontal area of each array region 102, the microelectronic device 216 may include additional control logic sections individually including additional control logic devices (e.g., control logic devices other than SA devices and SWD devices). For example, for each array region 102, additional control logic sections 228 may be positioned horizontally between (e.g., at relatively more horizontally central positions within the array region 102) the SA sections 218 and the SWD sections 220. The additional control logic sections 228 may include, but are not limited to, column decoder device sections including column decoder device, and main word line (MWD) sections including MWD devices.

Still referring to FIG. 12, within a horizontal area of each socket region 108, the microelectronic device 216 may include further control logic sections 230 individually including further control logic devices (e.g., control logic devices in addition to those located within the horizontal areas of the array regions 102). At least some of the further control logic devices within the further control logic sections 230 may have different configurations and different operational functions than the control logic devices located within the horizontal areas of the array regions 102. By way of non-limiting example, the further control logic sections 230 may include bank logic sections including bank logic devices.

Thus, in accordance with embodiments of the disclosure, a method of forming a microelectronic device comprises forming a first semiconductor wafer comprising memory cells within array regions, digit lines coupled to the memory cells and terminating within digit line exit regions neighboring the array regions, and word lines coupled to the memory cells and terminating within word line exit regions neighboring the array regions. A second semiconductor wafer comprising control logic devices is formed. The second semiconductor wafer is attached to the first semiconductor wafer through oxide-oxide bonding such that some of the control logic devices are positioned within the array regions. Digit line contact structures are formed within the digit line exit regions after attaching the second semiconductor wafer to the first semiconductor wafer. The digit line contact structures are coupled to the digit lines and some of the control logic devices. Word line contact structures are formed within the word line exit regions after attaching the second semiconductor wafer to the first semiconductor wafer. The word line contact structures are coupled to the word lines and some other of the control logic devices.

Furthermore, in accordance with embodiments of the disclosure, a microelectronic device comprises array regions, digit line exit regions, and word line exit regions. The array regions individually comprise memory cells, digit lines, word lines, and control logic devices. The memory cells comprise access devices and storage node devices. The digit lines are coupled to the access devices and extend in a first direction. The word lines are coupled to the access devices and extend in a second direction orthogonal to the first direction. The control logic devices are over and in electrical communication with the memory cells. The digit line exit regions horizontally alternate with the array regions in the first direction. The digit line exit regions individually comprise portions of the digit lines extending beyond the array regions adjacent thereto, and digit line contact structures individually continuously vertically extending from the portions of the digit lines to routing structures vertically overlying transistors of the control logic devices. The word line exit regions horizontally alternate with the array regions in the second direction. The word line exit regions individually comprise portions of the word lines extending beyond the array regions adjacent thereto, conductive contact structures on the portions of the word lines, and word line contact structures individually continuously vertically extending from the conductive contact structures to the routing structures vertically overlying the transistors of the control logic devices.

Figure 13:
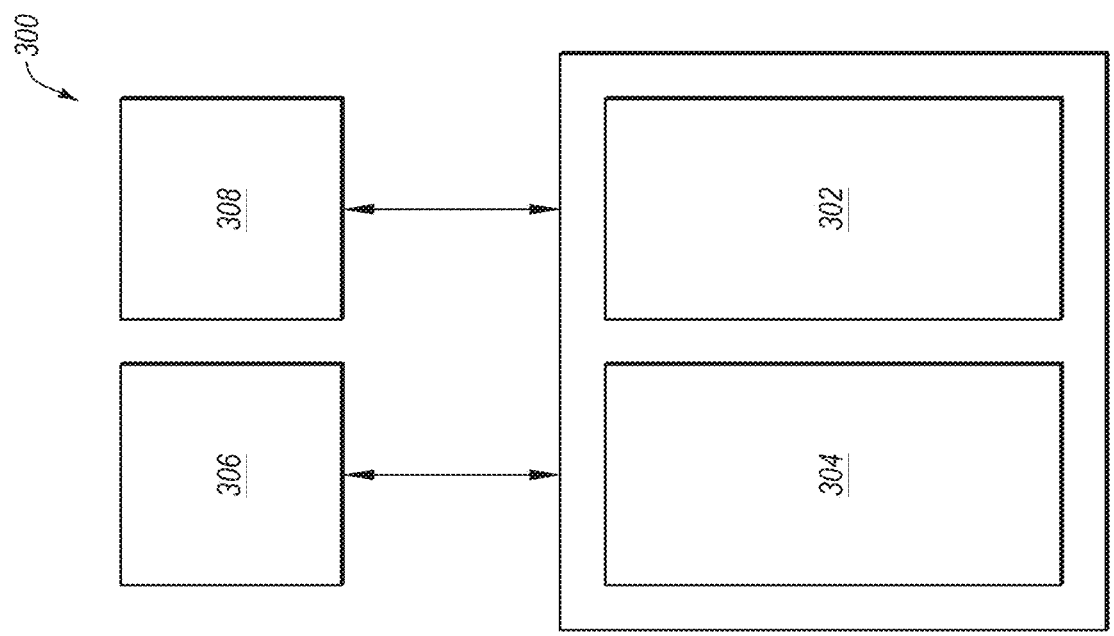
FIG. 13 is a schematic block diagram of an electronic system, in accordance with an embodiment of the disclosure.

Microelectronic devices (e.g., the microelectronic device 216 (FIGS. 11A through 11D)) in accordance with embodiments of the disclosure may be used in embodiments of electronic systems of the disclosure. For example, FIG. 13 is a block diagram illustrating an electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 300 includes at least one memory device 302. The memory device 302 may comprise, for example, a microelectronic device (e.g., the microelectronic device 216 (FIGS. 11A through 11D and 12)) previously described herein. The electronic system 300 may further include at least one electronic signal processor device 304 (often referred to as a "microprocessor"). The electronic signal processor device 304 may, optionally, comprise a microelectronic device (e.g., the microelectronic device 216 (FIGS. 11A through 11D and 12)) previously described herein. While the memory device 302 and the electronic signal processor device 304 are depicted as two (2) separate devices in FIG. 13, in additional embodiments, a single (e.g., only one) memory/processor device having the functionalities of the memory device 302 and the electronic signal processor device 304 is included in the electronic system 300. In such embodiments, the memory/processor device may include a microelectronic device (e.g., the microelectronic device 216 (FIGS. 11A through 11D and 12)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably connected to the input device and the output device, and a memory device operably connected to the processor device. The memory device comprises memory array regions, a digit line contact region between two of the memory array regions neighboring one another in a first direction, and a word line contact region between two other of the memory array regions neighboring one another in a second direction perpendicular to the first direction. The memory array regions each comprise dynamic random access memory (DRAM) cells, digit lines coupled to the DRAM cells, word lines coupled to the DRAM cells, and control logic circuitry overlying and in electrical communication with the DRAM cells. The control logic circuitry comprises transistors including gate structures vertically overlying channel structures. The digit line contact region comprises end portions of some of the digit lines extending past horizontal boundaries of the two of the memory array regions; and digit line contacts on the end portions of the some of the digit lines and continuously extending to a vertical position of the control logic circuitry. The word line contact region comprises end portions of some of the word lines extending past horizontal boundaries of the two other of the memory array regions; conductive contacts on the end portions of the some of the word lines; and word line contacts on the conductive contacts and continuously extending to the vertical position of the control logic circuitry.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A microelectronic device, comprising:
array regions individually comprising:
memory cells comprising access devices and storage node devices;
digit lines coupled to the access devices and extending in a first direction;
word lines coupled to the access devices and extending in a second direction orthogonal to the first direction; and
control logic devices over and in electrical communication with the memory cells;
digit line exit regions horizontally alternating with the array regions in the first direction and individually comprising:
portions of the digit lines extending beyond the array regions adjacent thereto; and
digit line contact structures individually continuously vertically extending from the portions of the digit lines to routing structures vertically overlying transistors of the control logic devices; and
word line exit regions horizontally alternating with the array regions in the second direction and individually comprising:
portions of the word lines extending beyond the array regions adjacent thereto;
conductive contact structures on the portions of the word lines; and
word line contact structures individually continuously vertically extending from the conductive contact structures to the routing structures vertically overlying the transistors of the control logic devices.

2. The microelectronic device of claim 1, wherein source regions and drain regions of the transistors of the conductive contact structures are vertically interposed between the storage node devices of the memory cells and gate electrodes of the transistors.

3. The microelectronic device of claim 2, wherein the digit line contact structures physically contact upper surfaces of the portions of the digit lines and side surfaces of portions of the routing structures within the digit line exit regions.

4. The microelectronic device of claim 1, wherein the word line contact structures physically contact upper surfaces of the conductive contact structures and side surfaces of portions of the routing structures within the word line exit regions.

5. The microelectronic device of claim 1, further comprising socket regions horizontally offset from the array regions, the digit line exit regions, and the word line exit regions, the socket regions individually comprising additional control logic devices vertically overlying the memory cells of the array regions and having different configurations and operational functions than the control logic devices.

6. The microelectronic device of claim 1, wherein the control logic devices within each array region of the array regions comprise:
sense amplifier devices within two sense amplifier regions positioned proximate corners of the array region diagonally opposing one another; and
sub-word line driver devices within two sub-word line driver regions positioned proximate additional corners of the array region diagonally opposing one another.

7. The microelectronic device of claim 6, wherein, for each sense amplifier region of the two sense amplifier regions within the array region:
some of the sense amplifier devices within the sense amplifier region are coupled to some of the digit lines horizontally extending through the array region; and
some other of the sense amplifier devices within the sense amplifier region are coupled to some of the digit lines horizontally extending through an additional one of the array regions horizontally neighboring the array region.

8. The microelectronic device of claim 7, wherein:
the some of the sense amplifier devices are coupled to the some of the digit lines horizontally extending through the array region by way of some of the digit line contact structures and some of the routing structures within one of the digit line exit regions horizontally interposed between the array region and the additional one of the array regions; and the some other of the sense amplifier devices are coupled to the some of the digit lines horizontally extending through the additional one of the array regions by way of some other of the digit line contact structures and some other of the routing structures within the one of the digit line exit regions.

9. The microelectronic device of claim 6, wherein, for each sub-word line driver region of the two sub-word line driver regions within the array region:

some of the sub-word line driver devices within the sub-word line driver region are coupled to some of the word lines horizontally extending through the array region; and some other of the sub-word line driver devices within the sub-word line driver region are coupled to some of the word lines horizontally extending through an additional one of the array regions horizontally neighboring the array region.

10. The microelectronic device of claim 9, wherein:

the some of the sub-word line driver devices are coupled to the some of the word lines horizontally extending through the array region by way of some of the conductive contact structures, some of the word line contact structures, and some of the routing structures within one of the word line exit regions horizontally interposed between the array region and the additional one of the array regions; and the some other of the sub-word line driver devices are coupled to the some of the word lines horizontally extending through the additional one of the array regions by way of some other of the conductive contact structures, some other of the word line contact structures, and some other of the routing structures within the one of the word line exit regions.

11. An electronic system, comprising:

an input device;

an output device;

a processor device operably connected to the input device and the output device; and a memory device operably connected to the processor device and comprising:

memory array regions each comprising:
dynamic random access memory (DRAM) cells;
digit lines coupled to the DRAM cells;
word lines coupled to the DRAM cells; and
control logic circuitry overlying and in electrical communication with the DRAM cells, the control logic circuitry comprising transistors including gate structures vertically overlying channel structures;

a digit line contact region horizontally interposed between two of the memory array regions horizontally neighboring one another in a first direction, the digit line contact region comprising:
end portions of some of the digit lines extending past horizontal boundaries of the two of the memory array regions; and
digit line contacts on the end portions of the some of the digit lines and continuously extending to a vertical position of the control logic circuitry; and a word line contact region horizontally interposed between two other of the memory array regions horizontally neighboring one another in a second direction perpendicular to the first direction, the word line contact region comprising:
end portions of some of the word lines extending past horizontal boundaries of the two other of the memory array regions;
conductive contacts on the end portions of the some of the word lines; and
word line contacts on the conductive contacts and continuously extending to the vertical position of the control logic circuitry.

12. The electronic system of claim 11, wherein the control logic circuitry comprises sense amplifier circuitry substantially confined within horizontal areas of the memory array regions and coupled to the digit line contacts.

13. The electronic system of claim 12, wherein the control logic circuitry further comprises sub-word line driver circuitry horizontally offset from the sense amplifier circuitry and substantially confined within horizontal areas of the memory array regions, the sub-word line driver circuitry coupled to the word line contacts.

14. The electronic system of claim 11, further comprising a back-end-of-line (BEOL) socket region outside of horizontal areas of the memory array regions, the digit line contact region, and the word line contact region, the BEOL socket region comprising additional control logic circuitry vertically overlying the DRAM cells of the memory array regions and having different configurations and operational functions than the control logic circuitry.

15. A microelectronic device, comprising:

a first microelectronic device structure comprising:
memory cells within array regions;
digit lines coupled to the memory cells and terminating within digit line exit regions neighboring the array regions; and
word lines coupled to the memory cells and terminating within word line exit regions neighboring the array regions;

a second microelectronic device structure vertically overlying and bonded to the first microelectronic device structure, the second microelectronic device structure comprising:
sense amplifier circuitry within horizontal areas of the array regions of the first microelectronic device structure; and
sub-word line driver circuitry within the horizontal areas of the array regions of the first microelectronic device structure;

digit line contact structures within horizontal areas of the digit line exit regions of the first microelectronic device structure and vertically extending through the first microelectronic device and the second microelectronic device structure, the digit line contact structures coupling the digit lines of the first microelectronic device structure to the sense amplifier circuitry of the second microelectronic device structure; and word line contact structures within horizontal areas of the word line exit regions of the first microelectronic device structure and vertically extending through the first microelectronic device and the second microelectronic device structure, the digit line contact structures coupling the word lines of the first microelectronic device structure to the sub-word line driver circuitry of the second microelectronic device structure.

16. The microelectronic device of claim 15, wherein the memory cells of the first microelectronic device respectively comprise:

an access transistor; and a capacitor vertically overlying and coupled to the access transistor.

17. The microelectronic device of claim 16, wherein channels of transistors of the sense amplifier circuitry and the sub-word line driver circuitry of the second microelectronic device structure are vertically positioned closer to the memory cells of the first microelectronic device than are gate electrodes of the transistors.

18. The microelectronic device of claim 17, further comprising back-end-of-line (BEOL) structures vertically overlying the sense amplifier circuitry and the sub-word line driver circuitry of the second microelectronic device structure, the BEOL structures comprising:
   routing structures comprising copper vertically overlying the sense amplifier circuitry and the sub-word line driver circuitry; and
   pad structures comprising aluminum vertically overlying and coupled to the routing structures.

19. The microelectronic device of claim 18, wherein the second microelectronic device structure further comprises additional control logic circuitry outside of the horizontal areas of the array regions of the first microelectronic device structure and coupled to the BEOL structures.

20. The microelectronic device of claim 15, wherein the second microelectronic device structure is bonded to the first microelectronic device structure through oxide-to-oxide bonds between isolation material of the first microelectronic device structure and additional isolation material of the second microelectronic device structure.

* * * * *

UNITED STATES PATENT AND TRADEMARK OFFICE
CERTIFICATE OF CORRECTION

PATENT NO. : 12,262,532 B2  
APPLICATION NO. : 18/429004  
DATED : March 25, 2025  
INVENTOR(S) : Fatma Arzum Simsek-Ege Page 1 of 1

It is certified that error appears in the above-identified patent and that said Letters Patent is hereby corrected as shown below:

In the Specification

| | | |
|---|---|---|
| Column 1, | Line 11, | change "now U.S. U.S. Pat." to --now U.S. Pat.-- |
| Column 1, | Line 24, | change "for MICROELECTRONIC" to --for "MICROELECTRONIC-- |
| Column 5, | Line 67, | change "an Fe— and" to --an Fe- and-- |
| Column 6, | Line 1, | change "a Co— and Ni-based" to --a Co- and Ni-based-- |
| Column 6, | Line 1, | change "an Fe— and Co-based" to --an Fe- and Co-based-- |
| Column 6, | Line 2, | change "a Co— and" to --a Co- and-- |
| Column 6, | Line 2, | change "and Ni— and" to --and Ni- and-- |
| Column 6, | Line 23, | change "oxynitride ($SiO_x N_y$))," to --oxynitride ($SiO_xN_y$)),-- |
| Column 6, | Line 24, | change "oxycarbide ($SiO_x C_y$))," to --oxycarbide ($SiO_xC_y$)),-- |
| Column 6, | Lines 27-28, | change "carboxynitride ($SiO_x C_zN_y$))." to --carboxynitride ($SiO_xC_zN_y$)),-- |

Signed and Sealed this  
First Day of July, 2025

Coke Morgan Stewart  
*Acting Director of the United States Patent and Trademark Office*